United States Patent [19]
Tanaka

[11] 3,961,266
[45] June 1, 1976

[54] CHANNEL SEEKING TUNING SYSTEM

[75] Inventor: Akio Tanaka, Evanston, Ill.

[73] Assignee: Zenith Radio Corporation, Chicago, Ill.

[22] Filed: Jan. 3, 1974

[21] Appl. No.: 430,446

[52] U.S. Cl. .............................. 325/452; 325/468
[51] Int. Cl.[2] .......................................... H04B 1/06
[58] Field of Search .................... 334/14, 15, 16; 325/452–455, 457–459, 464, 465, 468–470; 331/1 R, 2, 4, 17, 18, 25

[56] References Cited
UNITED STATES PATENTS

| | | | |
|---|---|---|---|
| 3,568,083 | 3/1971 | Harzer | 331/4 |
| 3,736,513 | 5/1973 | Wilson | 325/468 X |
| 3,851,254 | 11/1974 | Merrell et al. | 325/455 |

Primary Examiner—Robert L. Griffin
Assistant Examiner—Robert Hearn
Attorney, Agent, or Firm—Joseph T. Downey; Nicholas A. Camasto

[57] ABSTRACT

A television tuning system employing a varactor tuner in which the local oscillator frequency is time sampled by an asynchronously gated counting system to provide tuning information for a channel number computer. The computer has a presettable modular scaler and presettable units and tens counters to derive the corresponding channel number and a fractional portion of the intrachannel spacing. A comparator is coupled to the channel number computer for comparing the derived channel number information with the desired or input channel number information. A keyboard-selected channel number is encoded and stored in a memory which supplies the information to the comparator and to a decoder display unit for visually displaying the selected channel number. The memory also supplies information to a band decoder which provides band preset information to the channel computer and selectively activates the VHF and UHF tuners. The comparator controls a ramp voltage source for adjusting the tuning status of the tuner until: (1) equality exists between the derived and desired channel numbers and (2) the modular residue representation of intrachannel spacing is within a predetermined range.

44 Claims, 15 Drawing Figures

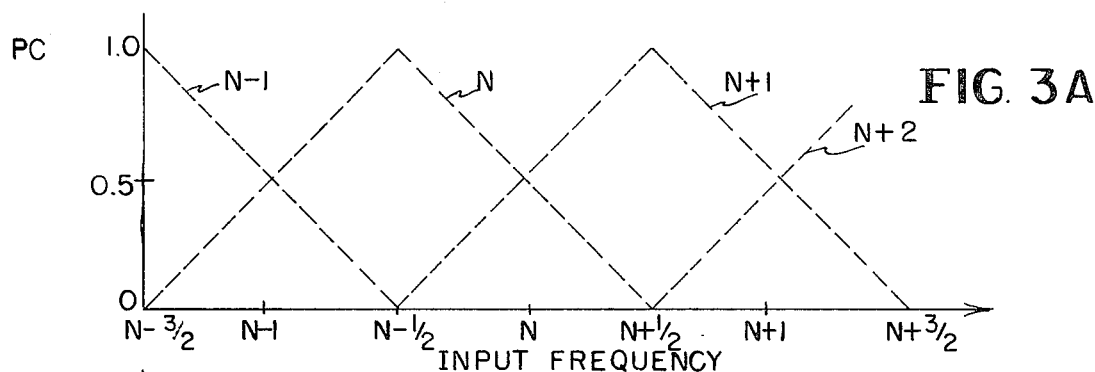
FIG. 3A
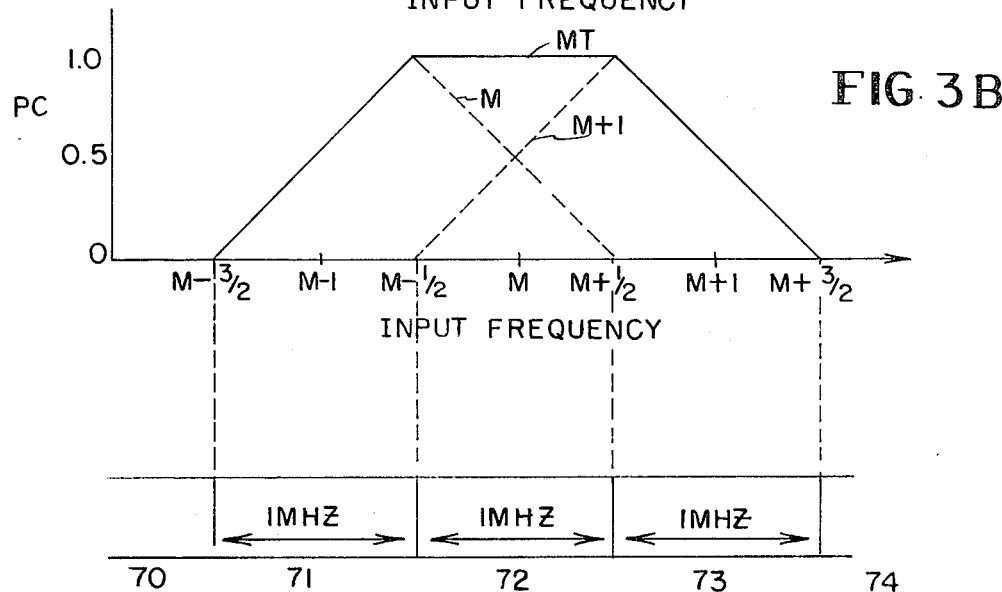
FIG. 3B
FIG. 6
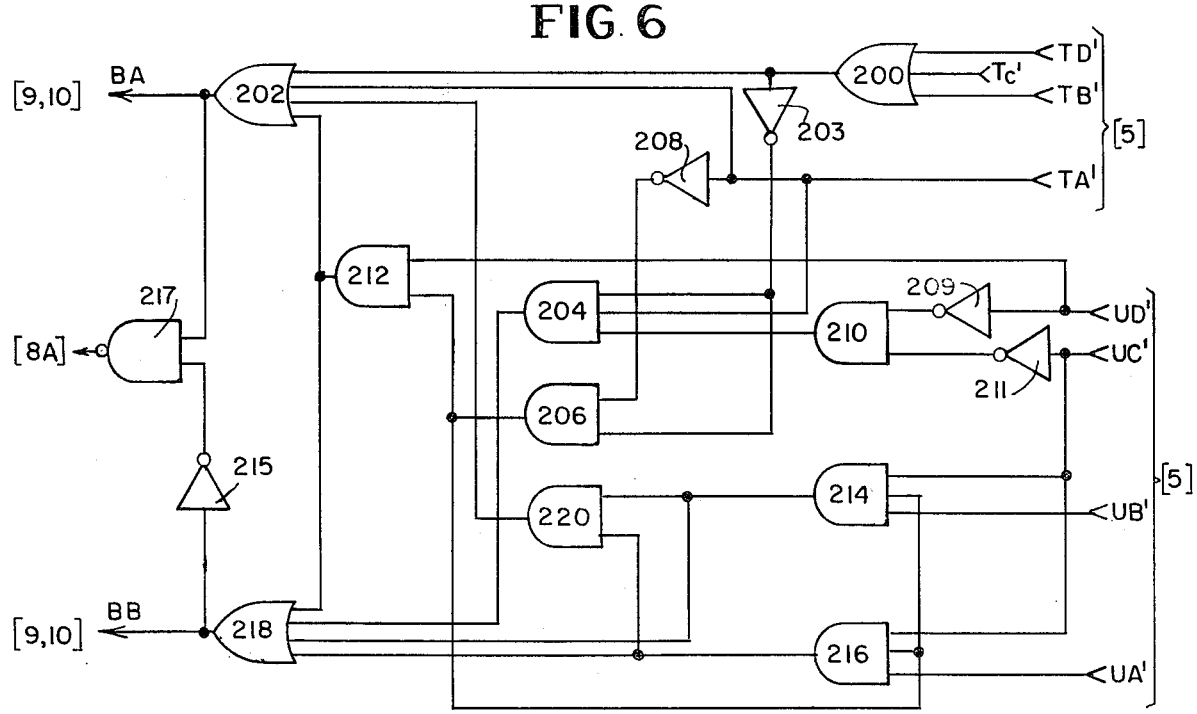

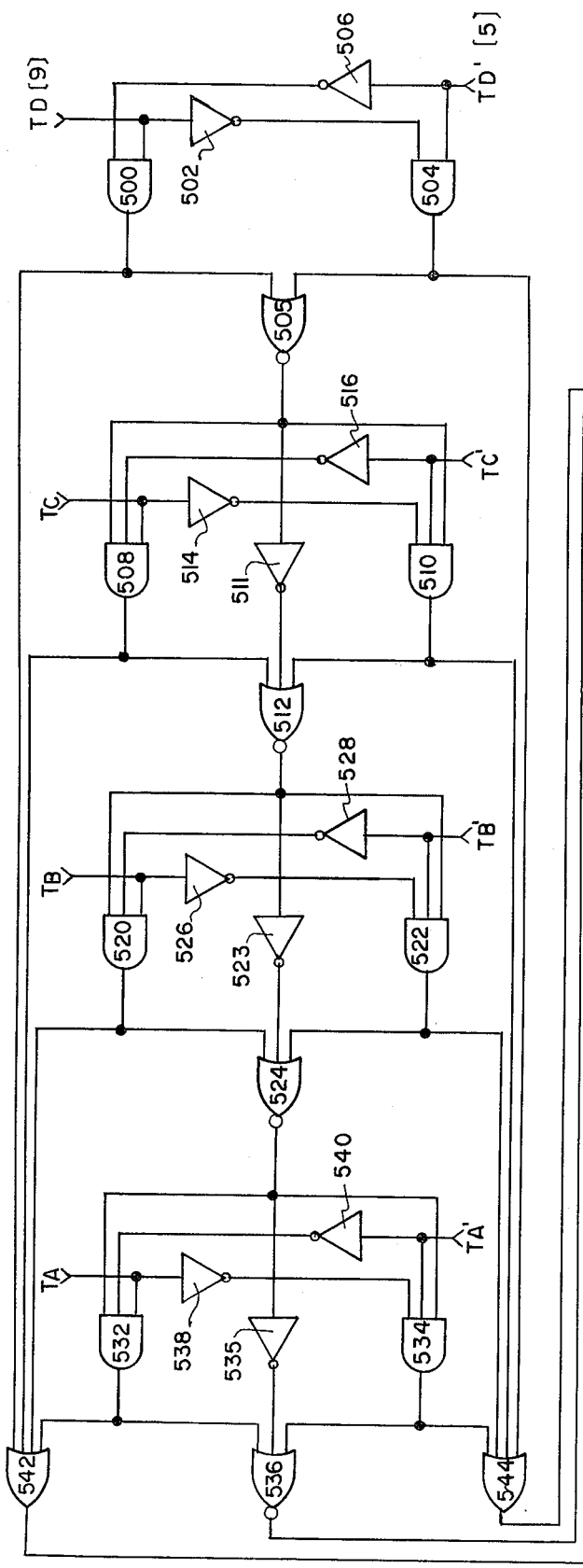
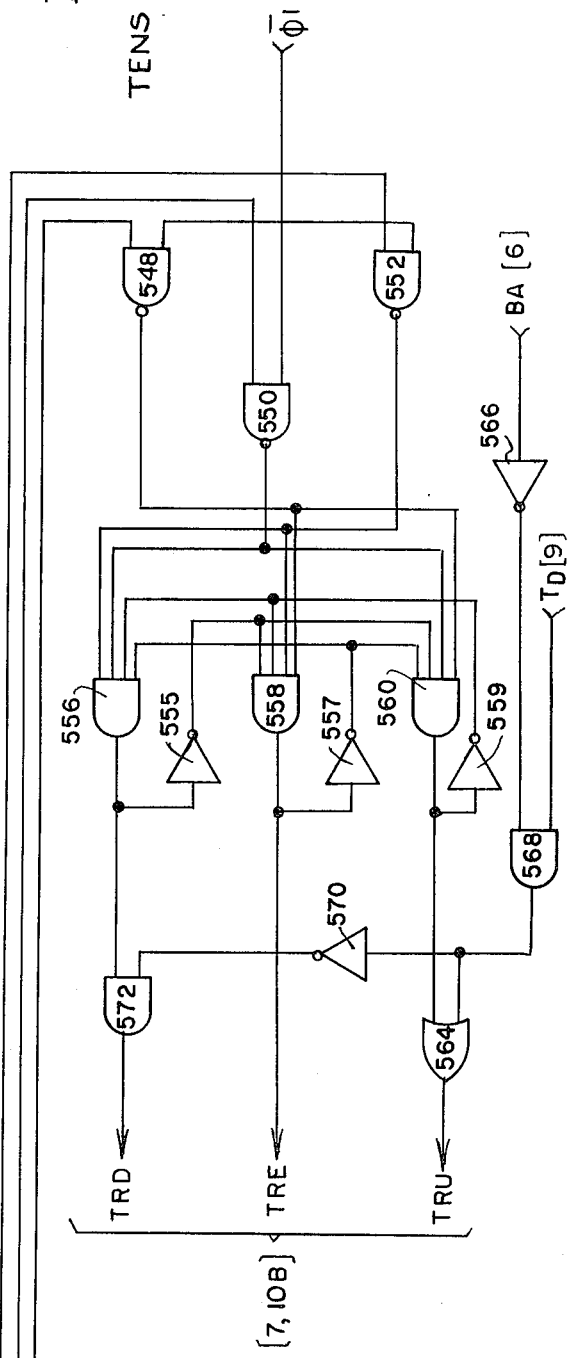
FIG. 10A TENS COMPARATOR 51A

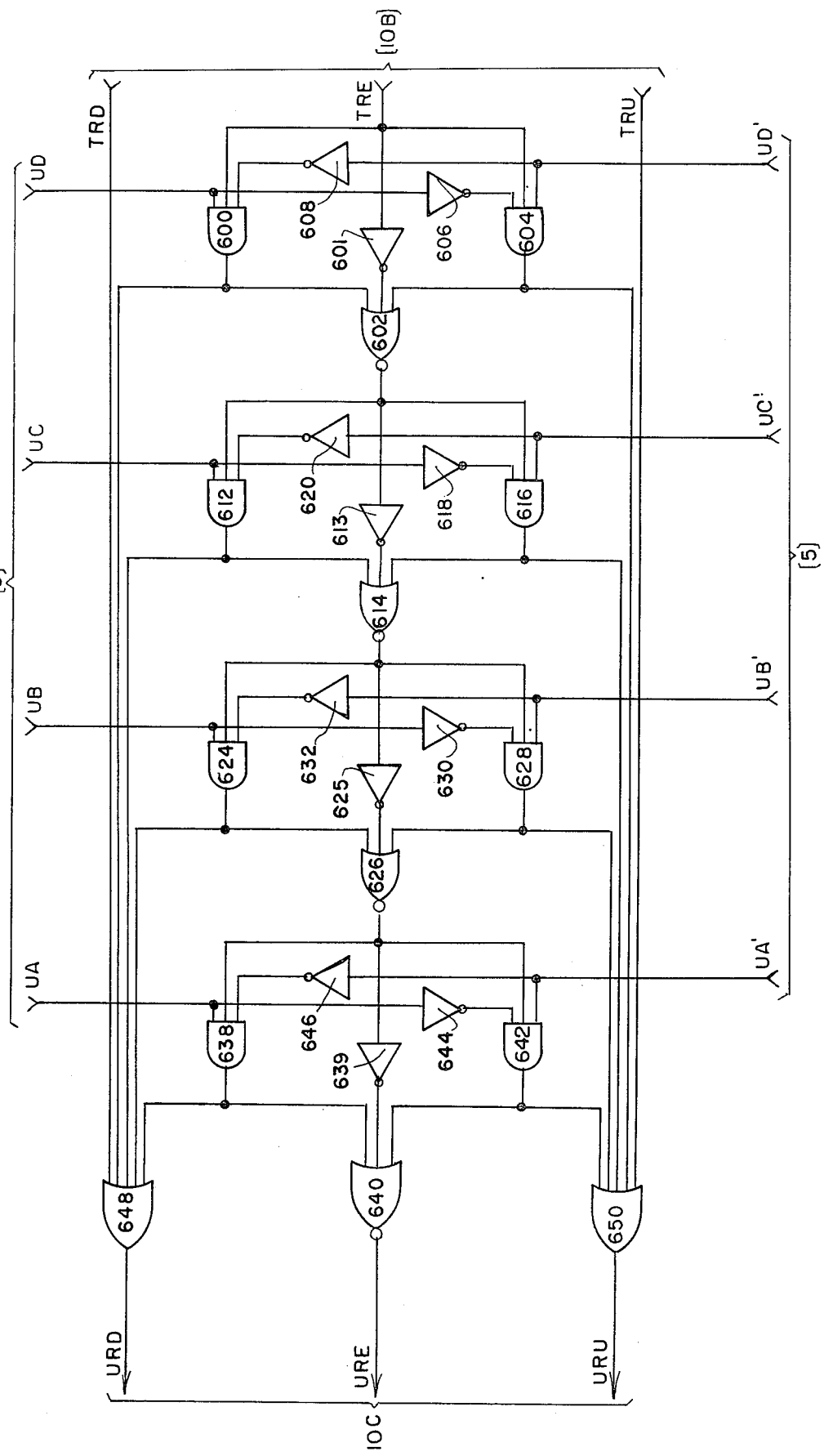
FIG. 10B UNITS COMPARATOR 51B

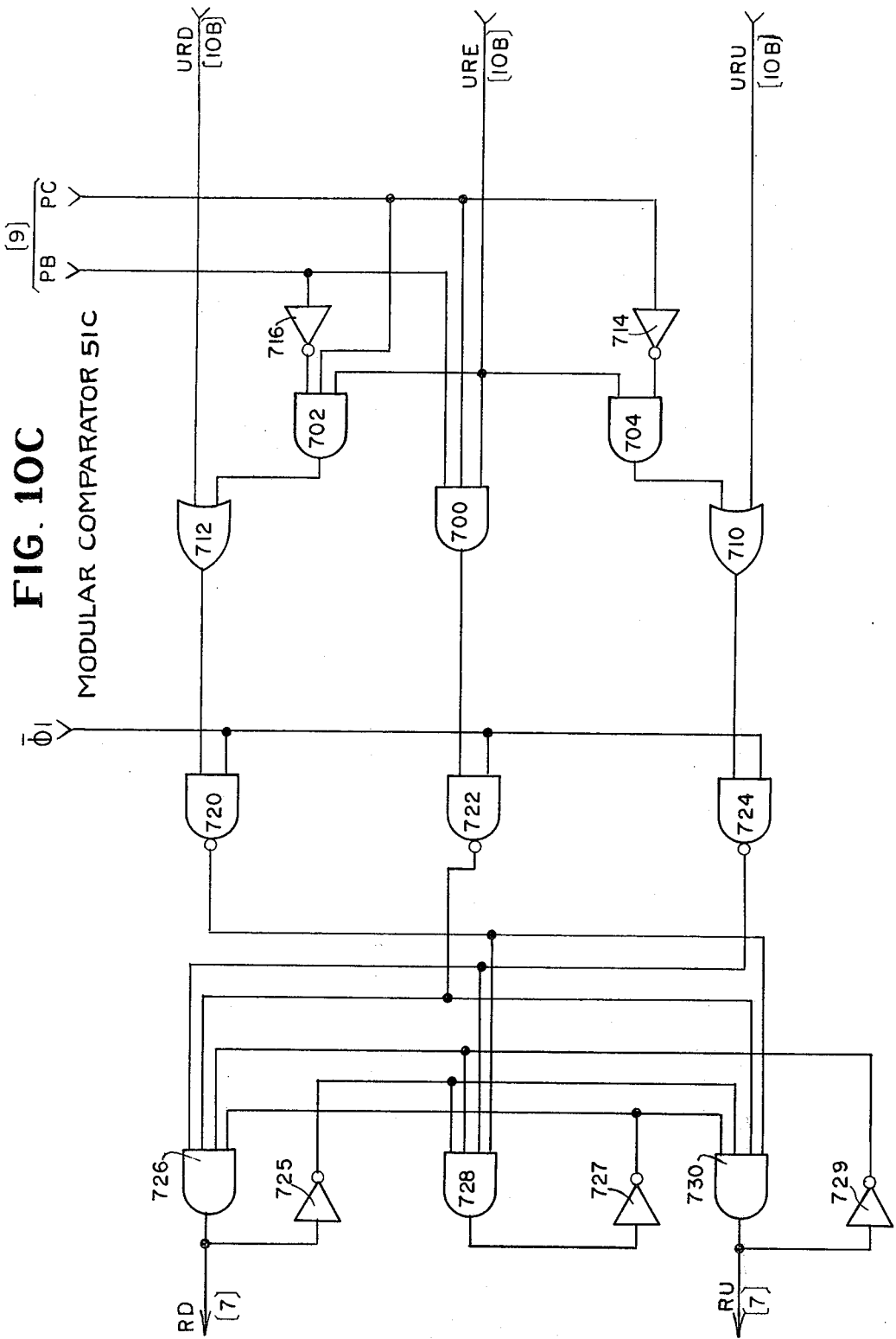

FIG. 11

TABLE 1 KEYBOARD

| CODE D'C'BA | | CODE D'C'BA | |
|---|---|---|---|
| 0000 | REST | 1000 | 8 |
| 0001 | 1 | 1001 | 9 |
| 0010 | 2 | 1010 | —NO |
| 0011 | 3 | 1011 | —NO |
| 0100 | 4 | 1100 | 0 |
| 0101 | 5 | 1101 | UP |
| 0110 | 6 | 1110 | DOWN |
| 0111 | 7 | 1111 | —NO |

TABLE 2 BAND DECODE

| BAND | CH | BA | BB | B1 | B2 | B3 | B4 |
|---|---|---|---|---|---|---|---|
| 1 | 2-4 | O | O | O | — | — | — |
| 2 | 5-6 | O | — | — | O | — | — |
| 3 | 7-13 | — | O | — | — | O | — |
| 4 | 14-83 | — | — | — | — | — | O |

TABLE 3 ST'D. REPRESENTATION

| DCBA | | DCBA | |
|---|---|---|---|
| 0000 | 0 | 0101 | 5 |
| 0001 | 1 | 0110 | 6 |
| 0010 | 2 | 0111 | 7 |
| 0011 | 3 | 1000 | 8 |
| 0100 | 4 | 1001 | 9 |

TABLE 4 MOD. SCALER

| STATE | 400 | 402 | 404 | Q OUTPUT | |
|---|---|---|---|---|---|
| 1 | O | O | O | O | O |
| 2 | — | — | O | — | — |
| 3 | — | — | — | — | O |
| 4 | — | — | — | O | — |
| 5 | O | — | — | — | — |
| 6 | O | O | — | — | — |

TABLE 5 PRESET INFORMATION

| BAND | MOD. STATE | UNITS | TENS |
|---|---|---|---|
| 1 | 5 | 5 | 8 |
| 2 | 1 | 5 | 8 |
| 3 | 5 | 0 | 7 |
| 4 | 3 | 8 | 2 |

CHANNEL SEEKING TUNING SYSTEM

CROSS REFERENCE TO RELATED PATENT APPLICATIONS

This application is related to the following applications all of which are assigned to the assignee of the present application: U.S. Pat. No. 3,851,254 entitled "Digital Systems and Method for Determining and Displaying a Television Channel Number", in the names of Richard G. Merrell and Akio Tanaka, Serial No. U.S. Pat. No. 3,931,579, entitled "Digital Signal Seeking Tuning System", in the names of John Ma and Akio Tanaka, Ser. No. 466,579, filed May 3, 1974, entitled "All Electronic Digital Tuner System with Memory" in the names of John Ma and Akio Tanaka, Ser. No. 484,475, filed July 1, 1974, entitled "Band Decoder for All Channel Digital Tuning System" in the name of Akio Tanaka, Ser. No. 492,365, filed July 29, 1974, entitled "Signal Seeking Tuning System with Illegal Channel Detection" in the name of Akio Tanaka, Ser. No. 503,122, filed Sept. 4, 1974, entitled "Television Tuning System with Varactor Malfunction Detection" in the name of Akio Tanaka, Ser. No. 504,638, filed Sept. 9, 1974, entitled "Multi-Speed Pamp for a Varactor Tuning System" in the names of Melvin C. Hendrickson and Richard G. Merrell, and Ser. No. 511,837, filed Oct. 3, 1974, entitled "Television Tuning System Indicator" in the name of Akio Tanaka.

BACKGROUND OF THE INVENTION

1. Field of the Invention

The present invention relates generally to television tuning systems and more particularly to a tuning system employing a plurality of logic gates interconnected to provide counting and decoding of a local oscillator frequency for comparison with encoded viewer input channel information.

2. Description of the Prior Art

The FCC rulings requiring equalized tuning capability for television signals in both VHF and UHF frequency bands and the increasing use of varactor tuners have provided the impetus for developing new electronic tuning systems. These new tuning systems have several advantages over the widely used mechanical turret type tuning systems, among the more important being increased operational speed, reliability and quietness. Most electronic tuning systems are of the limited channel type and are programmable to receive, with equal ease of tuning, any of a number of channels, usually about 14. A problem which is indigenous to all-channel television tuning systems is that the FCC television channel frequencies are allocated in four disconnected frequency bands, whereas the corresponding channel identification numbers (exclusively used by viewers for identification) run serially without regard to the frequency band interruptions. Thus, there are problems in translating input information in channel number form since the television reception circuitry operates in a frequency domain.

There are two types of all-channel tuning systems employing varactor tuners: a direct type which applies a selected voltage to tune the tuner independently of a received signal; and an indirect type which uses error signal information to drive the tuner until proper tuning is achieved. The former system, while less complicated, requires exacting calibration for the characteristics of individual varactors whereas the latter system may be designed around average varactor characteristics.

A paper by Doyle and Mills in BTR, Volume 15, Number 2, July, 1969, discusses some possible electronically controlled varactor tuning systems. A channel selection and indication system is described in block diagram form. It employs a varactor tuner and means for detecting the received television signal and comparing its frequency with the channel number input information. The detection methods described are a frequency synthesizer and a marker (or birdy) synchronizing synthesizer. With either detection method, a comparator compares the incoming signal frequency with the input channel number information and, at equality, operates to send a stop signal to a tuner ramp voltage drive. A phase-lock loop may be used to maintain equality between the detected signal frequency and the input channel frequency.

A paper by Dexter appearing in the Jan. 18, 1970, issue of ELECTRONIC DESIGN describes a method for improving the frequency stability of a radio tuner with a closed loop digital automatic frequency control (AFC). An electronic counter measures the local oscillator frequency, by counting with respect to a known time base, and a comparator compares the last digit in the counter with a preselected number. At equality, a signal is produced to terminate adjustment of the local oscillator frequency. Thus, fine tuning is related to the allocated frequency of the radio station and achieved without reference to the incoming signal. The system is described as an adjunct to a conventional method of coarse tuning the oscillator with the digital AFC analyzing the last digit of the derived local oscillator frequency with respect to a preselected digit. The author alludes to the broader use of digital AFC as a tuning mechansim, but doesn't go into any detail. Further, as will be apparent later, comparison of the last digit has a number of shortcomings.

A later paper by Doyle et al. in BTR, Volume 18, Number 4, November, 1972, shows an all-channel tuning system of the birdy frequency synthesizer type which includes an additional reference division to provide finer control of tuning when the tuner approaches the desired frequency. The oscillator is swept through a band of frequencies containing the desired frequency and a birdy is generated as each 6 MHz harmonic is passed. This signal is filtered and fed to a sweep control circuit. When the birdy immediately preceding the desired channel is reached, as determined by counting, an additional divider is activated to produce birdies which are 1 MHz apart.

The tuning system described in U.S. Pat. No. 3,654,557, issued Apr. 7, 1972, uses an arbitrarily selected binary encoding of channel numbers to designate a limited number of individual potentiometers for supplying corresponding preset voltages to a varactor tuner. The system input is from a keyboard which has one switch for each of the allowed programmed channel positions. Each channel position has a corresponding binary encoded number which determines the location of a corresponding preset potentiometer for coupling to the varactor tuner. This system includes a viewer controlled switch which connects clock pulses to a series of gated flip-flops interconnected to form a counter capable of indexing through the allotted group of binary numbers. A viewer, by use of this additional switch, may initiate channel indexing and, while observing the channel number display, stop the tuner at the desired channel by releasing the switch.

A paper by Sakamoto and Ichinohe in BTR, Volume 18, Number 3, August, 1972, discusses an improvement of the system in U.S. Pat. No. 3,654,557 including use of an eight bit binary encoded signal which corresponds to an input of a two digit channel number. The encoded signal is stored in a shift register and, through a series of logic gates, activates the potentiometer corresponding to the selected channel number. One signal lead from the shift register is used to determine the required tuning band and activate the appropriate tuner and another signal lead supplies a decimal decoder for driving a visual channel number display. As before, the system requires a separate potentiometer for each channel to be selected. The improvement lies in using a two digit channel number to determine the location of a corresponding potentiometer for subsequent coupling to the varactor tuner.

U.S. Pat. No. 3,509,484, issued Apr. 28, 1970, describes a digital logic system, including a prescaler gated with a divided-down clock signal, for displaying the frequency of an oscillator. The gated output is sequentially divided in a series of decade counters and the resultant frequency count is displayed. While not constituting a tuning system, the disclosure shows a digital counting method of deriving and displaying the frequency of an oscillator.

The above-mentioned related application, Ser. No. 326,724, filed Jan. 26, 1973, by Merrell and Tanaka, discloses a method and apparatus for sampling the local oscillator frequency with a counting system to derive the television channel number to which the tuner is tuned. The output of a logic gate, in which a reference clock signal gates a local oscillator signal, is used to drive a modular scaler, a units counter and a tens counter. All are presettable with the modular scaler operating in conjunction with the tens and units counters to decode the local oscillator output signal into the corresponding channel number.

Since the television spectrum is divided into four discontinuous frequency bands, labelled Low band VHF, Mid band VHF, High band VHF and UHF, different presets are supplied for each band. The band presets are sequentially changed whenever an "overcount" or "undercount" condition occurs which indicates that the incoming signal is in a different band than that for which the scaler and counters are preset. Thus, a first attempt at a count may yield an erroneous result, but the system functions on a time sampling basis to automatically reset the counters and begin the counting cycle again in the next band (with a different set of presets). Regardless of the tuner frequency, the counting system produces a correct indication of the corresponding channel number.

As will be seen, all of the proposed and existing systems suffer from one or more difficulties overcome by the system of the invention. Neither a frequency synthesizer or birdy counter type tuning system is continuous; that is, a "one-time" effort is made to tune to the desired television frequency. In the birdy counter, if the carrier corresponding to the selected channel is not present, or fades after tuning, or if for any reason the birdy count is lost, the system tuning becomes indeterminate and tuning must be reinitiated; that is, the birdy count must begin again. Elaborate filtering is also required to eliminate the harmonics which may cause picture or tuning interference, or both. As mentioned in one of the above papers, an improved birdy counting system employs means for "slowing down the count" to prevent overshooting the desired carrier frequency as the receiver tuning frequency approaches the desired signal frequency. However, the other deficiencies of birdy counting systems are still present. The frequency synthesizer operates on an error signal and should the frequency deviation generate an error signal outside the locking range of the phase lock loop, the system loses tuning.

The Dexter digital automatic frequency control (DAFC) system alleviates the problem of tuning dial inaccuracy and local oscillator drift. Dexter monitors the least significant digit of the oscillator frequency digit. However, he describes that certain severe environmental conditions, particularly high vibration, could cause oscillator frequency changes in excess of that measurable by the last digit. For example, if the system is set to monitor a last digit of five, an oscillator change of 15, would not be detected. The Dexter solution is to add more digits to the comparator to guard against such gross changes. The Dexter DAFC system thus maintains a single preselected frequency to the degree of accuracy of his counter. The paper discusses narrowing the timing frequency range in conjunction with a closed loop control system to provide an extremely accurate dial readout. It may be recalled that this system is independent of received signals.

Any practical television tuning system must be capable of dealing with signals subject to broadcast frequency discrepancies, signals handled by relay systems, signals affected by transmission problems and those rebroadcast for cable television systems. The last, in particular, may suffer from severe carrier frequency errors. An extremely accurate tuning, independent of the received signal, could cause a severe loss of information, and be unusable. Conversely, a broader acceptable tuning range renders the system susceptible to tuning to spurious signals.

In the direct tuning system discussed, a separate potentiometer is required for each channel and, in an all-channel system, this necessitates 82 potentiometers. Even in the modified form, which accepts channel number input commands encoded into appropriate "addresses" of the corresponding potentiometers, the basic difficulty with any all-channel direct tuning system remains. That is, each channel control voltage must be specified and tailored to the characteristics of the individual varactor tuner.

One alternative direct tuning system provides a fixed read-only-memory which is tailored to the individual varactor tuner for supplying the appropriate tuning voltage for each channel. This system encounters the difficulty of the DAFC system in that it either has an insufficient margin for error in system response to accommodate off frequency channels or atmospheric distortions of the broadcast signal, or the acceptable tuning range is so broad as to render it susceptible to operation with spurious or adjacent channel signals. Additionally, it requires programming the memory for all 82 channels though only a relatively few channels may ever be received.

These and other shortcomings in the prior art systems are overcome with the novel tuning system of the invention which is: (1) channel-number-accessed, (2) capable of specifying any designated channel in the discontinuous television bands to within a narrow frequency region (which precludes tuning to adjacent channels or other spurious signals), and (3) capable of accepting signals with minor deviations from their allotted signal frequency. The system is adaptable to any varactor tuner without requiring tailoring for individual characteristics and eliminates costly calibration. The system operation is continuous on a time sampling basis and is not disturbed by variations in the incoming signal, nor will it change tuning, even though the carrier signal disappears.

In accordance with the invention, a digital signal representative of the tuner local oscillator frequency is supplied to one input of a comparator with a digital signal representative of a desired channel number being supplied to the other input. The local oscillator frequency and, hence the system tuning, is varied in accordance with a correction signal which is dependent upon the state of the comparator. As a result of the desired channel number input, a driving ramp voltage is applied to the varactor and effectively results in a systematic channel-by-channel search for a predetermined acceptable region of frequencies about the desired channel frequency. The search is carried out at a very high speed, with a repetitive time sampling and comparison technique and, as far as the viewer is concerned, is practically instantaneous. The acceptance region is defined by a "window" which is made narrow enough to define the desired channel without adjacent channel interference, yet broad enough to permit minor deviations in carrier frequency without initiating corrective action.

In the preferred implementation of the invention, the tuning system incorporates a presettable modular scaler which drives presettable units and tens counters. Any base for the modular scaler may be chosen in conjunction with its preset information and the other counters and their preset information) to provide correct decoding of the oscillator frequency into the corresponding channel number regardless of its frequency band location. Thus, having a predetermined modulus (base), the modular scaler preset determines how many counts are required to provide a pulse to the units counter. The units counter functions in a similar manner to supply pulses to the tens counter. The base of the modular scaler is selected to produce a desired relationship for the intrachannel frequency spacing. Within the frequency window maintained by the tuning system, a normal automatic frequency control (AFC) in the receiver operates to lock the local oscillator frequency to the picture IF carrier. Since the tuning system operates on the local oscillator frequency, there is no dependence on individual characteristics of the varactor other than the requirement that the tuner drive system must be capable of tuning the varactor tuner over all channels.

OBJECTS OF THE INVENTION

An object of this invention is to provide a novel television tuning system and method.

It is another object of this invention to provide an improved all electronic, all channel tuning system and method.

It is yet another object of this invention to provide a television tuning system which is adaptable for manufacturing in integrated circuit form.

A further object of this invention is to provide an improved tuning system in which channel selection is accomplished automatically in response to a channel number input.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

FIGS. 3A and 3B show probability diagrams for general asynchronously gated counting and for combined residues of modular counting;

FIG. 6 shows the band determination control logic circuitry in block 52 of FIG. 2 which segregates the channels according to their channel numbers;

FIGS. 10A, 10B, and 10C show the comparator logic circuitry comprising the units and tens comparators and the modular scaler residue comparator, along with associated triflop circuitry, all of which is contained in block 51 of FIG. 2; and FIG. 11 comprises a plurality of Tables 1–5 where:
Table 1 shows the binary digit representations corresponding to channel number and command inputs from the keyboard;
Table 2 shows the channel bands and corresponding channel numbers and binary coding therefor, used in the tuning band control logic;
Table 3 shows the standard binary representation of decimal numbers;
Table 4 shows the six states of the modular scaler and its corresponding flip-flop outputs;
Table 5 shows the appropriate band preset information for the modular scaler and units and tens counters.

DESCRIPTION OF THE PREFERRED EMBODIMENT

Figure 1:
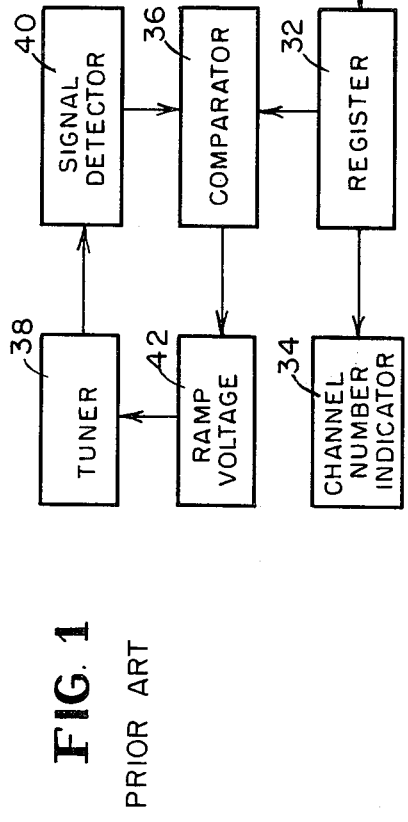
FIG. 1 depicts a block diagram of a prior art television tuning system.

In FIG. 1, a block diagram of a prior art tuning system is shown. A viewer controllable channel number input 30 is coupled to a temporary storage register 32 which is connected to a channel number indicator 34 for providing a display of the selected channel number. Temporary storage register 32 supplies channel information to a comparator 36. Channel number input 30, register 32 and indicator 34 comprise the viewer controllable portion of the tuning system.

Attached to a varactor controlled tuner 38 is a signal detector 40 for detecting the oscillator frequency and deriving the tuner status, i.e., the frequency of the broadcast television signal to which is is tuned. The information from detector 40 is supplied to a comparator 36 where a comparison is made with the desired signal information in register 32. A ramp voltage generator 42 varies the tuning voltage on varactor tuner 38 until comparator 36 indicates an equality condition, at which point, ramp voltage generator 42 stops changing the voltage on tuner 38. This is essentially the tuning system described in the paper by Doyle and Mills.

Figure 2:
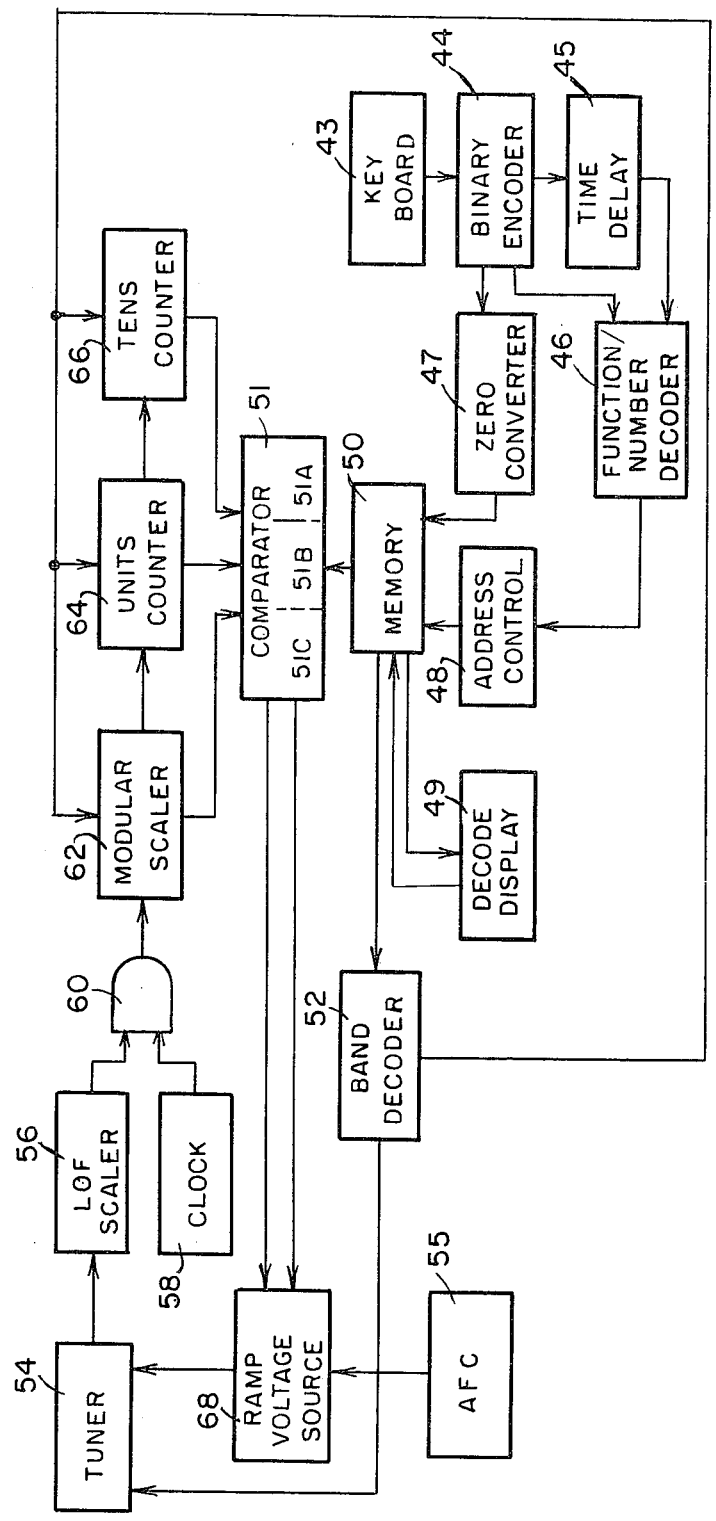
FIG. 2 depicts, in block diagram form, a tuning system employing the invention.

FIG. 2 is a block diagram depicting a tuning system constructed in accordance with the invention. A channel number keyboard 43 includes means for entering either desired channel number information or tuning commands to tune the tuner. The keyboard information is encoded into a special binary representation (See Table 1, FIG. 11) in encoder 44, supplied to a zero converter 47 and, both directly and through a time delay system 45, to a function/number decoder 46. The purpose of time delay system 45 is to eliminate spurious signals which might be generated by keyboard contact bounce. The directly supplied information to decoder 46 assists in the determination of the proper address or position in a memory 50. As will be explained later in detail, zero converter 47 functions to alter the special binary representation used in the encoder to the standard binary representation (See Table 3, FIG. 11) employed in the remainder of the system. The output of zero converter 47 supplies channel number information in standard binary form to the designated position in memory 50.

The keyboard input can be either a channel number digit or an Up or Down tuning command. The word "command" is used throughout to indicate an Up or Down signal input. The function/number decoder firstly determines which of an Up or Down command has been given and secondly distinguishes between commands and channel numbers. If an Up or Down command is entered at the keyboard, address control 48 causes an advance to the next position of the memory. Additional commands result in address control 48 sequentially indexing memory 50 through its available memory positions. Connected to the output of memory 50 is a decode display 49 which provides a visual indication of the channel number at that memory address. Thus, the viewer receives a visual indication of the selected channel information.

The tuning system has two functional modes designated program and operate. In the program mode, information is entered by the keyboard and stored in the memory by use of the Up and Down commands which cause a serial advancement of accessible memory address positions, whereupon the channel number information is supplied from the keyboard. In the operate mode, an Up or Down command causes advancement to the next sequential address position and information is supplied from the memory to a comparator 51 to cause tuning to the channel represented by the stored channel information. In this mode, a "scratch pad" memory position is automatically accessed upon the input of a channel number and permits direct tuning by the viewer to any selected channel.

Another output of memory 50 is connected to a band decoder 52 which determines, from the encoded channel information stored in memory 50, (1) in which of the several discontinuous frequency bands the selected channel is; (2) whether UHF or VHF circuitry in the tuner is activated; and (3) the preset information supplied to the channel computing means for decoding of the oscillator frequency. Thus, an output of band decoder 52 is connected to a varactor tuner 54 and another output is connected in common to a modular scaler 62, a units counter 64 and a tens counter 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of a clock pulse generator 58 are coupled to the inputs of a logic gate 60. The signal on the output of gate 60 constitutes the tuning information and comprises a train of oscillator frequency-related pulses in fixed time intervals. The oscillator frequency is determined by counting the number of pulses in an interval. The output of logic gate 60 is connected to modular scaler 62 which, in turn, is connected to units counter 64 which, in turn, is connected to tens counter 66. On a time sample basis, the tuning information is supplied to the appropriately present modular scaler and counters which, in the preferred embodiment, determine the channel number corresponding to the television frequency to which the tuner is tuned. The circuitry from the LOF scaler to the comparator constitutes the channel computing means.

The outputs of modular scaler 62 and counters 64 and 66 are connected to comparator 51 which has a modular section 51C, a units section 51B and a tens section 51A, where the derived channel number is compared with the desired channel number. As each comparison is made, signals dependent upon the condition of comparator 51 are coupled to ramp voltage source 68 for controlling both the tuning voltage direction and rate of change. The output voltage from ramp voltage source 68 drives tuner 54 to make corrective changes in its local oscillator frequency, until comparator 51 indicates equality between the derived channel number and desired channel number and, as will be described, that the tuned signal is within a range of frequencies preselected by the window.

Window-Theory of Operation

The window is produced by selecting adjacent states of the modular scaler as the criteria, in conjunction with satisfaction of the units and tens counters, for proper tuning. When extended to frequency space, the window defines a range of frequencies substantially centered about the FCC allocated picture carrier frequency corresponding to the selected channel. The channel computer functions on a time sampling basis to determine the number of scaled down LOF pulses occurring during a fixed time interval. This information is processed to derive the channel number and intrachannel fraction corresponding to the tuner status (frequency to which the local oscillator is tuned) during the sample interval. The system compares the derived channel number with the desired signal channel number and analyzes the intrachannel fraction to determine when the tuner is tuned to accept signals falling within the valid range defined by the window.

Either synchronously or asynchronously gated counting methods may be used to derive the tuner status information. for simplicity, the terms synchronous counting and asynchronous counting will be used to indicate counting systems which are synchronously and asynchronously gated, respectively. In synchronous counting the local oscillator source of pulses is coupled to a clock pulse generator and a constant phase relationship between the clock pulse generator and the local oscillator frequency is maintained.

In asynchronous counting systems, there is no attempt to control the phase relationship between the clock pulse generator output (a square wave) and the oscillator related signal which, in the instant application, is also essentially a square wave. The clock pulse and the oscillator signal are supplied to a logic gate whose output is coupled to a counter. The gate is enabled or activated by the clock pulse on a repetitive time basis, permitting the counter to continually determine the frequency of the incoming oscillator signal. Because of the random phasing between the clock pulse and the oscillator output wave there is a finite probability of the counter indicating two results for successive measurements of a fixed frequency square wave signal input. This is due to the counter counting leading (or trailing) edges of the oscillator wave, and the effect of the random phase relationship between the clock pulse and oscillator wave at commencement of the sample. As will be shown, the counter can indicate one more count than would be expected for the time sample of the fixed frequency. Thus, an asynchronously gated counting system, although simple in design, has an inherent ambiguity.

A specific feature of this invention resides in circuitry using this inherent ambiguity in asynchronously gated counting systems to derive the window in a very simple manner.

The channel computer includes presettable channel number counters and a presettable modular scaler. The modular scaler drives or supplies information to the channel number counters and, at the end of each counting cycle, indicates a modular residue corresponding to a fraction of the intrachannel spacing of the tuner frequency. This tuning status information is supplied to a comparator which compares the desired or selected channel number with the derived channel number. The varactor tuner is driven until equality exists in the units and tens counters and either of two (or more) predetermined residues exist in the modular scaler which establish the window. The value of the residue (in conjunction with equality in the tens and units counters) determine when the tuner frequency is within the acceptable or valid frequency range defined by the window.

Because of the 6 MHz spacing between adjacent channels, i.e., between the picture carriers of adjacent channels, occurring within each of the discontinuous frequency bands, modular six arithmetic (or multiples thereof) and appropriate timing intervals become of particular significance. For any local oscillator frequency, a complete cycling of the modular scaler may be selected to correspond to a change of 6 MHz in oscillator frequency. Thus, in the preferred implementation of the invention, the number of cycles of the modular scaler corresponds to the number of 6 MHz frequency intervals or channels covered by the oscillator, subject to the condition that appropriate preset information for bridging the "gaps" between adjacent frequency bands is supplied to the other counters. This is generally taught in the copending application Ser. No. 326,724 mentioned above. It follows that with a modular 6 scaler and a one microsecond counting interval, the residues in the modular scaler will correspond to 1 MHz fractional portions of the intrachannel spacing.

The modular scaler is preset so that a predetermined residue corresponds to substantial centering of the oscillator frequency about the picture carrier frequencies for all channels within a given band. The modular scaler information is supplied as incremental additions to the units counter and is added to the preset count therein. Similarly the units counter supplies incremental additions to the tens counter, which are added to its preset count and the channel number is derived from the counters and a visible readout thereof presented to the viewer.

A scaler with a modulus of twelve could similarly be used to designate a smaller intrachannel fraction, i.e., 0.5 MHz, provided different appropriate presets were supplied to the scaler and to the units and tens counters and provided the sampling interval, or scaling factor, for the local oscillator pulses was changed accordingly. Thus, the difference between counting systems of different modulii is principally in the corresponding fractional value of the intrachannel spacing which the value of the residue in the modular scaler designates.

In accordance with the invention, two adjacent modular residues are selected as being acceptable. This selection, in conjunction with the statistical probability of an asynchronously gated counting system yielding two different readings for the identical time sampled frequency, specifies the window.

Assume an asynchronous counting system using a chain of modular 10 counters for counting the cycles of a square wave of fixed frequency "N" where "N" is an integer. Because of the non-synchronized gating, if the wave is sampled with a clock pulse of one second duration and either leading or trailing edges of the cycles are counted, repetitive counting samples will indicate an ambiguity in readings corresponding to a difference of one count. The reading will either be N or N+1 depending upon the relative phasing between the clock pulse and square wave. For a fixed frequency square wave, it can be shown empirically that there is an equal probability of the occurrences of counter readings of N and N+1. In statistical language the probability of the reading being N is 0.5 and the probability of the reading being N+1 is 0.5.

To aid in understanding this inherent ambiguity in asynchronously gated counting, consider a 1000 Hz square wave signal being varied in 0.1 Hz frequency increments, with a statistically significant number of frequency readings being made at each different frequency increment. The ratio of the two possible readings (1000 and 1001) to the total number of samples at each frequency yields their pobabilities. For the samples at 1000.0 Hz, the counter will read 1000 fifty percent of the time and 1001 fifty percent of the time. For a frequency of 1000.1 Hz, the counter will record a larger percentage of 1001 readings and a correspondingly smaller percentage of 1000 readings. As the frequency approaches 1000.5 Hz the number of 1000 readings will decrease to zero and the number of 1001 readings will increase to one hundred percent. Continuing on to 1000.6 Hz will yield no 1000 readings, a great percentage of 1001 readings and now a small percentage of 1002 readings. At 1001 Hz the counter will read 1001 fifty percent of the time and 1002 fifty percent of the time. It can be shown that intermediate frequencies yield probabilities following a linear relationship. A plot of the probability function (PC) is shown in FIG. 3A.

FIG. 3A is a graph of the probability of occurrence of specific residues using asynchronously gated counting during repetitive fixed time intervals. The triangular dashed line curves represent the probability of occurrence of the designated reading or residue remaining in the modular scaler at the end of the clock pulse timing interval. While the curves N−1, N, N+1 and N+2 are shown, the N and N+1 curves are of primary interest. It should be noted that for any given input frequency the sum of the probabilities must always be 1.0. The curve labelled N results from square waves of frequencies ranging between N+3/2 to N+1/2. Similarly, the N+1 curve results from square waves of frequencies varying N−1/2 and N+3/2.

In particular, looking at the curve labelled N, if the input frequency corresponds to N−1 there is a 0.5 probability of the counter reading N (there is also a 0.5 probability of the counter reading N-1, but that is of no interest in the present discussion). Moreover, if the input frequency is N−3/2 or less, or if the frequency is N+1/2 or more, there is a 0.0 probability of the counter reading N. Similarly, if the input frequency is N, the asynchronous counter has only a 0.5 probability of reading N. The curve labelled N+1 may be similarly derived for frequencies ranging between N−1/2 to N+3/2. The N and N+1 curves overlap at frequency N where a 0.5 probability exists for both N and N+1 being read by the counter. As described above, these data may be verified empirically.

A scaler with a modulus other than 10 functions in a similar manner, except that the correspondence between the input frequency and the scaler residue is not as clear. The combined probability curve MT for the selection of two adjacent residues in the modular scaler of the asynchronous pulse counter of the invention is shown in FIG. 3B. The figure represents the modular scaler residue only and it should be understood that the channel number location in the frequency spectrum must also be specified, that is, coincidence in the units and tens section of the comparator is also required for correct tuning.

Solid line curve MT is the summation of the two dashed line probability curves for acceptable residues of M and M+1 and is seen to be in form of a trapezoid. Since only residues M and M+1 are of interest only curve MT is shown. For frequencies falling in the range between M−1/2 and M+1/2, the probability is 1.0 (indicating with absolute certainty) that the scaler will read one or the other of the acceptable M and M+1 residues. For frequencies less than M−1/2, there is a diminishing probability that the residue will be acceptable. Actually there is 0 probability of a reading of M+1 and a diminishing probability of a reading of M. For frequencies less than M−3/2, there is 0 probability of the scaler indicating either acceptable residue. It is obvious that the same analysis may be extended to the regions of higher frequency with similar effect.

Selection of adjacent residues in the modular scaler establishes a window whereby, in response to a channel number input, the tuning system accepts as valid all frequencies which (1) satisfy the tens and units counters and (2) yields one of the residues, for example, M or M+1. Thus, signal frequencies falling within a range of frequencies about the desired local oscillator frequency (and only those frequencies) are acceptable. This enables the tuning system, which is continuously sampling the oscillator frequency, to have a "quiet space" and permits both tuning breadth, for handling the variety of signals available and tuning selectivity for rejecting adjacent channel and spurious signals.

Assume for illustrative purposes only, a sample interval of 1 microsecond and a modulus of 6. An oscillator frequency of 101 MHz will result in 16 groups of 6 pulses and a remainder of 5 pulses (101÷6=16+R5). 101 MHz corresponds to a channel 2 picture carrier frequency of 55.25 MHz and a receiver IF frequency of 45.75 MHz.

Assuming that it is preset to zero, the modular 6 scaler cycles 16 times (sending 16 pulses to the units counter) and has a residue of 5. The units counter sends a pulse to the tens counter each time it is cycled. Assuming proper presets in the units and tens counters, they can be arranged to read 2 and 0, respectively, with the 16 pulse input to the units counter. Further, the scaler preset may be selected to produce a residue in the scaler of, for example 3, for the modular 5 remainder (the units and tens presets need be adjusted accordingly).

Since adjacent channel picture carriers in the band are separated by 6MHz, the residue will be seen to be the same for the oscillator frequencies corresponding thereto. By appropriate selection of the presets for each of the bands, the modular scaler can be made to have the same residue for all picture carrier frequencies throughout the tuning spectrum.

The modulus of six with the 6 MHz television channels results in each residue unit conveniently corresponding to a frequency of 1 MHz. In FIG. 3B the 1 MHz regions are labelled 70–74, and an otherwise acceptable local oscillator frequency (one which satisfies the units and tens counters) producing a residue in region 70 will be too low, that is, lower than the acceptable frequencies specified by the two residue counts M and M+1. Thus in region 70, the comparator will always indicate that the derived count is less than the predetermined channel count (requiring an increase in oscillator frequency) and the tuning voltage will be adjusted accordingly, in a manner to be described.

Otherwise acceptable frequencies corresponding to region 71 have an increasing probability that their residues will have one of the two acceptable values of M and M+1. In this region, for some samples, the comparator will indicate the tuning frequency is lower than the selected frequency and for other samples, the tuning frequency will be deemed acceptable. The tuner ramp voltage source is activated when an unacceptable count is indicated by an inequality in either the units or tens counters or in the modular scaler. The probability of successive frequency samples showing acceptable residues increases as the tuning frequency approaches region 72.

Region 72 covers a 1 MHz frequency space which is defined by the window. For frequencies satisfying the units and tens counters and having residues within this region the comparator always indicates equality and no control signal requesting a change in tuning is initiated. When a desired channel number is put into the tuning system, it is this 1 MHz region about the allocated channel picture IF frequency to which the tuner is brought. No external signal is needed, although in the television receiver a conventional automatic frequency control system is incorporated to provide signal tracking within the range of frequencies defined by the window. Increasing oscillator frequencies fall in region 73 where some samples will show equality in the comparator and others will indicate that the residue corresponds to a frequency higher than that selected and cause corrective action to be taken. Oscillator frequencies in region 74 will always be recognized as too high.

Definitions

For simplicity, only logic connections are shown in the figures and only voltage sources and grounds necessary to establish the logic control signal levels are shown. Positive logic is used throughout and logic gates are simply referred to by their functional names, i.e., AND, NAND, OR and NOR, without the word "gate". A 1 represents a high logic (or signal voltage) level and a 0 corresponds to a low logic level. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels.

All binary representations are conventionally arranged in descending powers of 2 from left to right. Leads labelled D, B, C and A and D' and C' interchangeably represent binary digits or bits as well as lead identification. Similarly leads may be identified by the functional signals they carry. Leads connected to parts in another figure, in addition to their normal designations will, where practical, be followed by the appropriate figure number enclosed in square brackets.

The terms "input" and "output" generally indicate the device terminal unless signal is specified. An open circle on an input terminal designates a negative edge triggered device. $\phi$ represents a timing pulse signal and $\overline{\phi}$ its inverse or complement. If $\phi$ is 0, $\overline{\phi}$ is 1 and vice-versa. The term "inhibit" indicates the condition in which a gate output is no longer dependent upon signas applied to its remaining inputs. The term "enable" designates the condition in which a gate output is dependent upon the signals applied too the remaining inputs.

As far as practical, the various portion of the tuning system will be described in detail on a functional basis.

Figure 4:
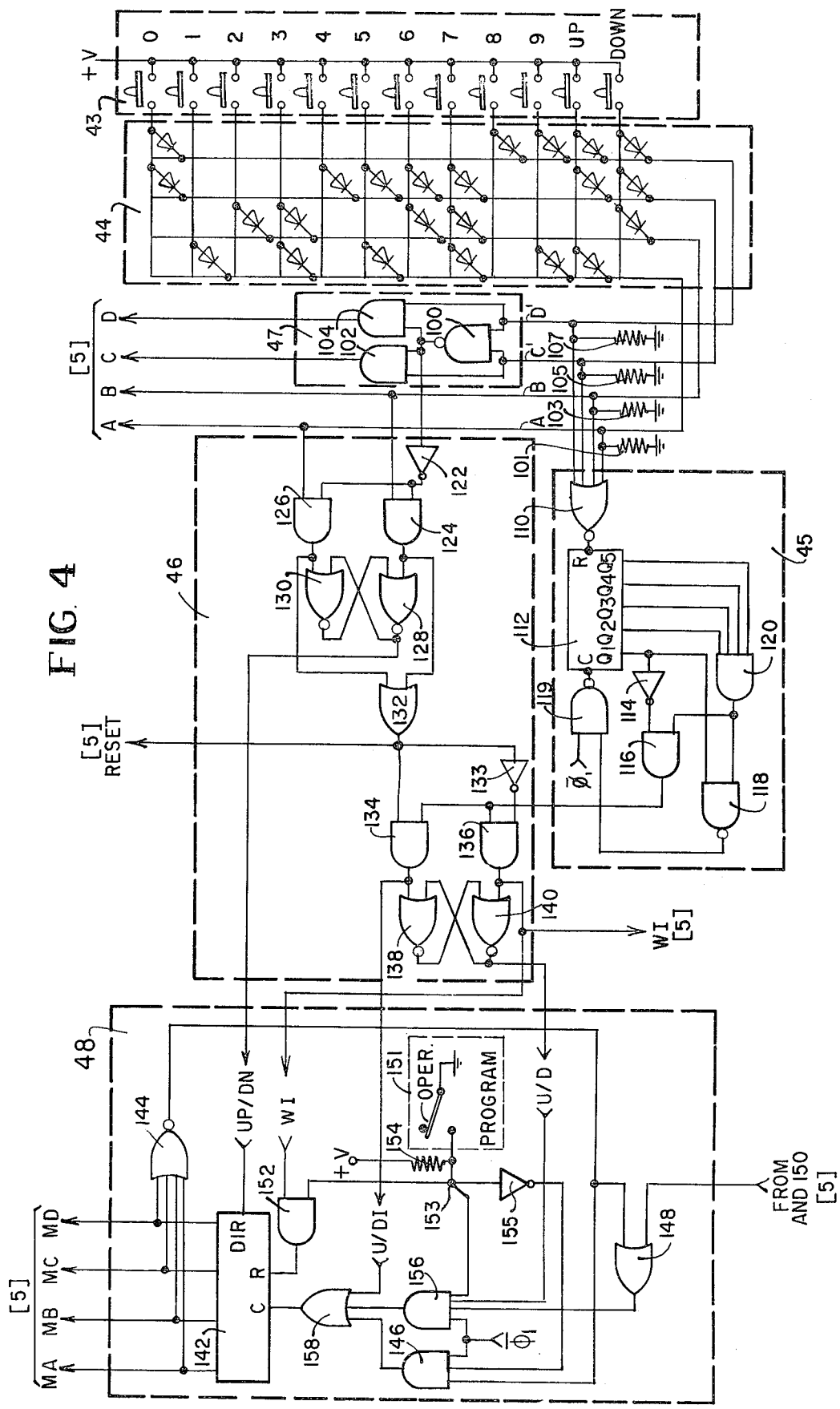
FIG. 4 shows the circuitry of blocks 43, 44, 45, 46, 47 and 48 of FIG. 2 which comprise the keyboard input arrangement, the function-number deocder and the address control system.

Keyboard 43 and Binary Encoder 44 (FIG. 4)

FIG. 4 shows the channel number selection means and includes binary encoder 44 comprising a diode matrix for encoding digits entered at keyboard 43. A source of positive voltage +V is applied to a parallel arrangement of switches, bearing appropriate identification in the form of digits 0–9 and UP and Down commands. The switches shown are single pole, single throw momentary contact type, but may be of any other suitable type. Each switch is selectively coupled by the diode matrix to an arrangement of four resistors 101, 103, 105 and 107 which are returned to ground. Switch operation establishes voltages on the resistors which correspond to the binary bit representation of the identifying digit or command associated with the selected switch. Voltages established on resistors 101, 103, 105 and 107 correspond respectively to the A, B, C' and D' special binary bit representations. The special binary coding for the keyboard is shown in Table 1 of FIG. 11.

Assume channel 29 is desired. The switch corresponding to the digit 2 is momentarily depressed and connects +V, through the appropriate diode in the matrix, to resistor 103. Resistor 103 is connected to lead B, which now has +V thereon (ignoring the small voltage drop across the diode), the remaining leads A, C' and D' being at ground potential. Thus the digit 2 is encoded, the configuration of binary bits being 0010 for D', C' B and A, respectively, where 1 represents +V and 0 represents ground.

The switch designated by the digit 9 is now momentarily depressed, which places +V, through the diode matrix, on resistor 107 and resistor 101. These resistors are connected, respectively, to the D' and A leads. Thus the binary representation for the digit 9 is 1001. In similar fashion, keyboard 43 and diode matrix 44 function to encode the remaining digits and commands. The Up command is encoded as binary 1101 for D'C'BA and the Down command as binary 1110.

Zero Converter 47 (FIG. 4)

The special keyboard binary representation does not conform to the standard binary representation upon which the comparator and other system components operate. Since it is desirable for the keyboard to have a rest position with no signal level being established, the standard binary configuration corresponding to the digit zero is chosen. Hence at rest, zero voltage levels are established on leads D'C'BA. For digit zero the standard binary representation for the decimal number 12 is used, namely 1100. A comparison of the binary representations of Table 1 and Table 2 shows that this is the only difference in the representations for the digits 0–9.

Zero converter 47 re-encodes the D'C'BA representation into standard DCBA form. C' and D' connect to the inputs of a NAND 100. C' and the output of NAND 100 connect to the inputs of an AND 102 and the output of NAND 100 connects to an input of an AND 104, with D' connecting to its other input. The output of AND 102 appears on lead C and the output of AND 104 appears on lead D, both corresponding to their counterparts C and D in the standard binary representation DCBA.

As mentioned above, the digit 9 keyboard binary representation on leads D', C', B and A is 1001. C' is at 0 and D' is at 1 and hence the inputs of NAND 100 are at 0 and 1. The output of NAND 100 is thus at 1 and the corresponding inputs of AND 102 and AND 104 are at 1. The two inputs of AND 102 are now at 0 and 1 and its output is at 0, while the inputs of AND 104 are both at 1 and its output is at 1. Leads C and D are respectively at 0 and at 1. Thus the leads D, C, B and A are respectively 1001 and the zero converter has had no effect.

However, a zero input digit has the keyboard binary representation 1100. C' and D' are both at 1. The inputs of NAND 100 are both at 1 and its output is at 0. One input each of AND 102 and AND 104 is at 0 and their outputs are at 0. The corresponding standard C and D binary bits are zero. Since the A and B binary bits are not affected by the zero converter, they are still at 0 and the keyboard special representation of zero (1100) is converted to the standard binary representation of 0000.

Time Delay 45 (FIG. 4)

As mentioned, a time delay is provided to delay interpretation of the keyboard binary signal to preclude response to false signals due to contact bounce. Time delay 45 employs a five stage counter 112 which delays the enabling of subsequent logic gates for thirty increments or one level pulses of the clock output timing signal $\phi_1$. $\overline{\phi}_1$ is selected for convenience but any other suitable pulse recurring each clock cycle may be employed for this purpose. Leads A, B, C' and D' are connected to the input of a NOR 110 whose output is connected to the reset terminal (R) of time delay counter 112. The Q1 output of counter 112 connects to one input of a NAND 118 and, after coupling through an inverter 114, connects to an input of an AND 116. The Q2-Q5 outputs of counter 112 connect to the four inputs of an AND 120. The output of AND 120 is coupled to the second input of each of AND 116 and NAND 118. The output of NAND 118 and clock signal $\overline{\phi}_1$ connect to the inputs of a NAND 119 whose output is connected to the clock terminal (C) of counter 112. The circle on the input terminal of counter 112 indicates that it is a negative edge triggered device, a convention employed throughout the description. The output of AND 116 connects to one input each of an AND 134 and an AND 136 for enabling these gates after the desired time delay.

A keyboard input which does not correspond to the rest position of 0000 causes NOR 110 to have a 0 level output signal which resets counter 112. The Q5-Q1 outputs of counter 112 indicate its count status in standard binary form and upon reset, are all at 0. As will be seen shortly, for this condition and during 29 subsequent $\overline{\phi}_1$ time pulses, the output of AND 116 is at 0, inhibiting gates 134 and 136. During this period, the output of AND 120 is at 0 and NAND 118 has a 1 level signal output which is applied with each 1 level $\overline{\phi}_1$ clock pulse on the inputs of NAND 119. For each occurrence of $\overline{\phi}_1$ at 1, the resulting 0 level output signal from NAND 119 is coupled to the clock input terminal of counter 112 and advances the counter one binary count.

The enabling of subsequent logic gates is delayed until counter 112 reaches a predetermined status. When counter 112 achieves the binary number, 11110 (Q5-Q1 respectively), which is a decimal count of 30, the normally 0 signal level output of AND 120 becomes a 1 signal level since outputs of Q2-Q5 are now all at 1. The 0 signal level at the Q1 output is coupled through inverter 114, resulting in the second input of AND 116 being at 1 and in AND 116 producing a 1 level output signal for enabling AND's 134 and 136. These gates remain enabled for one complete clock period, i.e., from the 30th to the 31st $\overline{\phi}_1$ at 1 pulse, which also determine the length of the "initiate" pulses in subsequent circuitry. Note that binary number 11110 in counter 112 is the only possible enabling count for gates 134 and 136 since no other count in the permissible range between 00000 and 11111 will result in both inputs of AND 116 being at 1. When the counter reaches 11111 the enabling pulse is terminated and the counter remains at this status awaiting another reset condition. Thus, the desired time delay is achieved.

Function/Number Decoder 46 (FIG. 4)

Function/number decoder 46 firstly distinguishes Up from Down commands and secondly channel number digit inputs from commands. An inverter 122, an AND 124, an AND 126, a NOR 128 and a NOR 130 form circuitry for distinguishing an Up from a Down command. NOR 128 and NOR 130 form a direct coupled RS flip-flop. The flip-flop remains in either of its two stable states, as indicated by the output signal level of NOR 128, until the signals at its inputs are changed to correspond to the other state. Its input signal levels are determined by two of the four possible combinations of 0 and 1 signal levels at the outputs of AND 124 and AND 126. When both inputs are at the same signal level (i.e., 0—0) no change in state occurs. The output of NOR 128 is at 1 for an Up command and at 0 for a Down command. For timing considerations an Up or Down command determination is made prior to differentiating between commands and digits.

The output of NAND 100 in zero converter 47 is connected through inverter 122 to one input each of AND 124 and AND 126. Lead A is connected to the second input of AND 126 and Lead B is connected to the second input of AND 124. The output of AND 124 connects to one input of an OR 132 and one input of NOR 128. The output of AND 126 is connected to the second input of OR 132 and to one input of NOR 130. The outputs of NOR 128 and 130 are cross-connected to their second inputs. An UP/DN signal is taken from the output of NOR 128 and supplied to a four stage address counter 142 for determining its direction of advancement. The counter does not count or advance at this time however. The output signal of OR 132 provides a reset pulse signal labelled RESET, which will be explained later.

Assume an Up command input (keyboard representation 1101). C' and D' are at 1 and the output of NAND 100 is at 0. The 0 signal level, through inverter 122, results in the corresponding inputs of AND 124 and AND 126 being at 1. Since B is at 0 and A is at 1, the second input of AND 124 is at 0 and the second input of AND 126 is at 1, making the outputs of AND 124 and AND 126 at 0 and 1, respectively. With these signals supplied to the flip-flop, the output of NOR 128 is at 1, indicating an Up command.

Similarly, with a Down command (keyboard representation 1110) the output of NOR 128 attains a 0 signal level. The Down and Up keyboard representations differ in that the A and B signal levels are interchanged with A at 0 and B at 1. Consequently, the second input of AND 126 is at 0, and the second input of AND 124 is at 1, resulting in the outputs of AND 124 and AND 126 being at 1 and 0, respectively. With these signals supplied to the flip-flop, the output of NOR 128 is at 0, indicating a Down command.

Since, for all other allowable input signals from the keyboard, at least one input each of AND 126 and AND 124 is at 0, these signals have no effect on the state of the flip-flop, which is solely determined by Up and Down commands.

As mentioned, an Up command results in the outputs of AND 124 and AND 126 being at 0 and 1, respectively, causing the output of OR 132 (RESET) to assume a 1 level. A Down command results in the output of AND 124 and AND 126 being at 1 and 0, respectively, and the output of OR 132, is also at a 1. However, it may be shown that for any other keyboard input the output of OR 132 and the corresponding RESET signal is at 0. Thus, the units and tens flip-flop 162 of FIG. 5, which receives the RESET pulse signal, is reset when an Up or a Down command is entered at the keyboard. The only other binary input which could produce a 1 level RESET signal is 1111, which input is not possible with the keyboard circuit arrangement.

Function/number decoder 46 further distinguishes commands from digits. The output of OR 132 is connected to a second input of AND 134 and through an inverter 133 to the second input of ANd 136. It will be recalled, that the first inputs of AND 134 and AND 136 receive the time-delayed enabling signals from the output of AND 116. The output of AND 134, labelled U/DI is an up or down initiate pulse. It has a 1 level for the period between the 30th and 31st $\bar{\phi}_1$ at 1 pulses when a command has been received. At all other times U/DI is at 0. U/DI 1 causes four stage address counter 142 to advance one count in a previously determined direction, under conditions to be more fully described below. The output of AND 134 is also connected to one input of a NOR 138. The output of AND 136, labelled WI for "write initiate", is a one level pulse during the period between the 30th and 31st $\bar{\phi}$ at 1 pulses when a digit has been entered at the keyboard and at all other times, WI is at 0.

The output of AND 136 is also supplied to one input of a NOR 140, which together with a NOR 138, form a second direct coupled RS flip-flop. NOR 140 assumes and maintains a 1 signal level output for commands and a 0 signal level output for digits. One input of NOR 138 is connected to the output of AND 134 and the outputs of NOR 138 and NOR 140 are cross-connected to form second inputs. The state of the flip-flop is indicated by the signal level on the output of NOR 140, labelled U/D, and inhibits or enables AND 156 which is part of the logic for controlling address counter 142.

For a digit input, the output of OR 132 is at 0 and in conjunction with a signal level of 1 on the output of AND 116 in time delay circuit 45, results in the outputs of AND 134 and AND 136 being at 0 and 1, respectively. Under these input conditions to the flip-flop, the output of NOR 140 is at 0.

A command input results in the output of OR 132 being at 1 which causes the outputs of AND 134 and AND 136 to be at 1 and 0, respectively, and the output of 140 to be at 1. As described for the first RS flip-flop, 0 on the outputs of AND 134 and AND 136 (which occurs for the keyboard rest condition input of 0000) has no effect upon the state of the flip-flop. Thus the output of NOR 140 (U/D signal) is at 1 for Up or Down commands and at 0 for digit inputs.

Address Control 48 (FIG. 4)

Address control 48 has a switch-controlled operate and program mode. In the program mode, 15 of 16 possible memory positions in a memory 50 (FIG. 5) are sequentially accessible by address counter 142 for loading or storing channel information. The 16th position is called a "scratch pad" memory position and is the one used by the viewer for direct access with a channel number input in the operate mode. In that mode, the channel tuning information stored at the 15 positions may be sequentially recalled by Up and Down commands. Also, in this mode a digit input from keyboard 43 automatically drives address counter 142 to the 16th or "scratch pad" memory position, thereby "skipping" all other memory positions. Thus the viewer may directly enter a desired channel number in the tuning system without sequencing through the various memory positions. The principal distinction between the modes is that channel number information may only be stored while the address control is in the program mode. Tuning, by direct access occurs in the operate mode and by sequencing the memory positions, in either mode.

Address control counter 142 is a 4-stage reversible binary counter having 16 possible states corresponding to the 16 addressable positions of the memory. When a 1 level signal is applied to reset terminal R, the counter assumes a 0000 state. The counter advances one count each time a 1 level signal is applied to clock terminal C. The direction of counting is dependent upon the UP/DN signal applied to the DIR terminal of the counter and is up (increase) for a 1 level signal and down (decrease) for a 0 level signal. The output leads of counter 142, labelled MA, MB, MC and MD are connected to the memory. The signals thereon constitute a binary coding of the addresses of the memory positions. MA, MB, MC and MD are connected to the inputs of a NOR 144 whose output is connected to one input of an AND 146 and to one input of and OR 148. The second input of OR 148 is connected to an output of an AND 150 in FIG. 5. (The inputs to AND 150 are connected to a pair of signal leads labelled ZU and ZT indicating the status of the units and tens memories. Leads Zu and ZT will be at a 1 level when the output of the corresponding memory position indicates respectively a 0 units or 0 tens digit.) The UP/DN signal from NOR 128 is applied to the DIR terminal of counter 142. The WI pulse signal from the output of AND 136 is supplied to one input of an AND 152. A program/operate switch 151 has its movable wiper connectable between ground and a resistor 154, the other end of resistor 154 being connected to a source of voltage +V. Switch 151 is schematically indicated by a dashed-line box. When switch 151 is closed, the system is in the program mode and a 0 level voltage (ground) is applied to junction 153. Conversely, when switch 151 is open, the operate mode is established and junction 153 is at a 1 level voltage. Junction 153 is connected to the second input of AND 152, an input of AND 156 and through an inverter 155 to a second input of AND 146. The output of AND 152 is connected to the R terminal on address counter 142. The U/D lead from NOR 140, the output of OR 148 and lead carrying timing pulse $\bar{\phi}_1$ are connected to the remaining inputs of AND 156. Timing pulse $\bar{\phi}_1$ is also supplied to the remaining input of AND 146. The outputs of AND 146 and AND 156 and an UP/Down Initiate (U/DI) lead from the output of AND 134 are connected to the inputs of an OR 158 whose output is connected to the clock terminal (C) of address counter 142.

The address of the "scratch pad" memory position in memory 50 is 0000 in counter 142. Access to this position can be had only in the operate mode and only when a digit is entered at the keyboard. The write initiate (WI) signal, which is a one clock period duration pulse from AND 136 is indicative of such a digit input and enables AND 152 by establishing an input thereof at 1. In the operate mode, switch 151 is open and junction 153 is at a 1 level voltage. Therefore, the second input of AND 152 is at 1 and the output of AND 152 (terminal R) is at a 1 level causing address counter 142 to reset to 0000. Thus, receipt of a WI pulse signal in the operate mode automatically causes counter 142 to read 0000, which is the scratch pad or direct access position in memory 50. The desired channel number information from the viewer is stored in the "scratch pad" position until a subsequent command or digit input is received. In the program mode AND 152 is inhibited because switch 151 is closed thereby establishing a signal level of 0 at one input of AND 152.

An Up or Down command, in either the program or operate mode, results in address counter 142 advancing in the direction determined by the signal on the UP/DN lead which is applied to the counter DIR terminal. Normally, both outputs of AND 146 and AND 156 will be at 0. The U/DI signal is also a short duration pulse (one clock cycle). When the U/DI lead is at a 1 level, in response to a command input, the output of OR 158 is at a 1 level and counter 142 is advanced one count in response to the 1 signal on its C terminal. The U/D signal, which it will be recalled is a 1 level for a command and a 0 level for digit, is coupled to an input of ANd 156 to either inhibit or enable advancement of counter 142 through AND 156.

Assume an Up (or Down) command is given in the operate mode resulting in address counter 142 advancing to the 0000 position. While the example is not realizable in the system except under highly transient conditions, it will serve as a good illustration of how the scratch pad memory position is skipped. The 1 level at junction 153 enables AND 156 and inhibits AND 146. A command input places the U/D lead at 1 (the second input of AND 156). The 0000 in counter 142 places the output of NOR 144 at 1 and this signal level is applied to an input of OR 148 which causes its output to be at 1, irrespective of its other input signal level. The 1 level output of OR 148 is connected to the third input of AND 156. When the $\bar{\phi}_1$ clock pulse is at 1 the four inputs of AND 156 are at 1 and therefore its output is at 1. Any 1 level input to OR 158 causes its output to be at 1 which advances address counter 142 by one binary count. Thus the counter "skips" to the next address and the "scratch pad" position is inaccessible by command input when in the operate mode. Under the same assumed conditions in the program mode, junction 153 is at 0, inhibiting AND 156, but through inverter 155 produces a one level signal at an input of AND 146. The output of NOR 144 is at 1 ( 0000 counter condition) and hence the second input of AND 146 is at 1. When the $\bar{\phi}_1$ at 1 timing pulse is received, the three inputs of AND 146 are at 1 and its output assumes a 1 level. Since the output of AND 146 is connected to OR 158, its output is at 1 and counter 142 is again advanced. Thus counter 142 is forced to skip the "scratch pad" position when an Up or Down command is received in either mode.

In the operate mode, any memory position with a stored 00 channel number is also skipped. For memory positions other than the "scratch pad" position, the output of NOR 144 which is coupled to an input of OR 148 is at 0. The second input of OR 148 is coupled to the 1 level output of AND 150 (FIG. 5) (because leads ZU and ZT are at 1). Therefore, the output of OR 148 is at 1, and in conjunction with the three other 1 signal levels on the inputs of AND 156, causes its output to be at 1. Just as in the case of the "scratch pad" skipping action, a 1 level inhibiting signal at an input of OR 158 causes a 1 level signal at the C terminal of address counter 142, advancing it by one count. Thus in the operate mode, a 00 channel number at a memory position results in address counter 142 being driven to the next sequential memory position. This skipping does not occur in the program mode because junction 153 is at a 0 level which inhibits AND 156 (through which a 1 level signal at the output of OR 148 must act) and thus each memory position (except the 16th is sequentially accessible by Up or Down commands).

Figure 5:
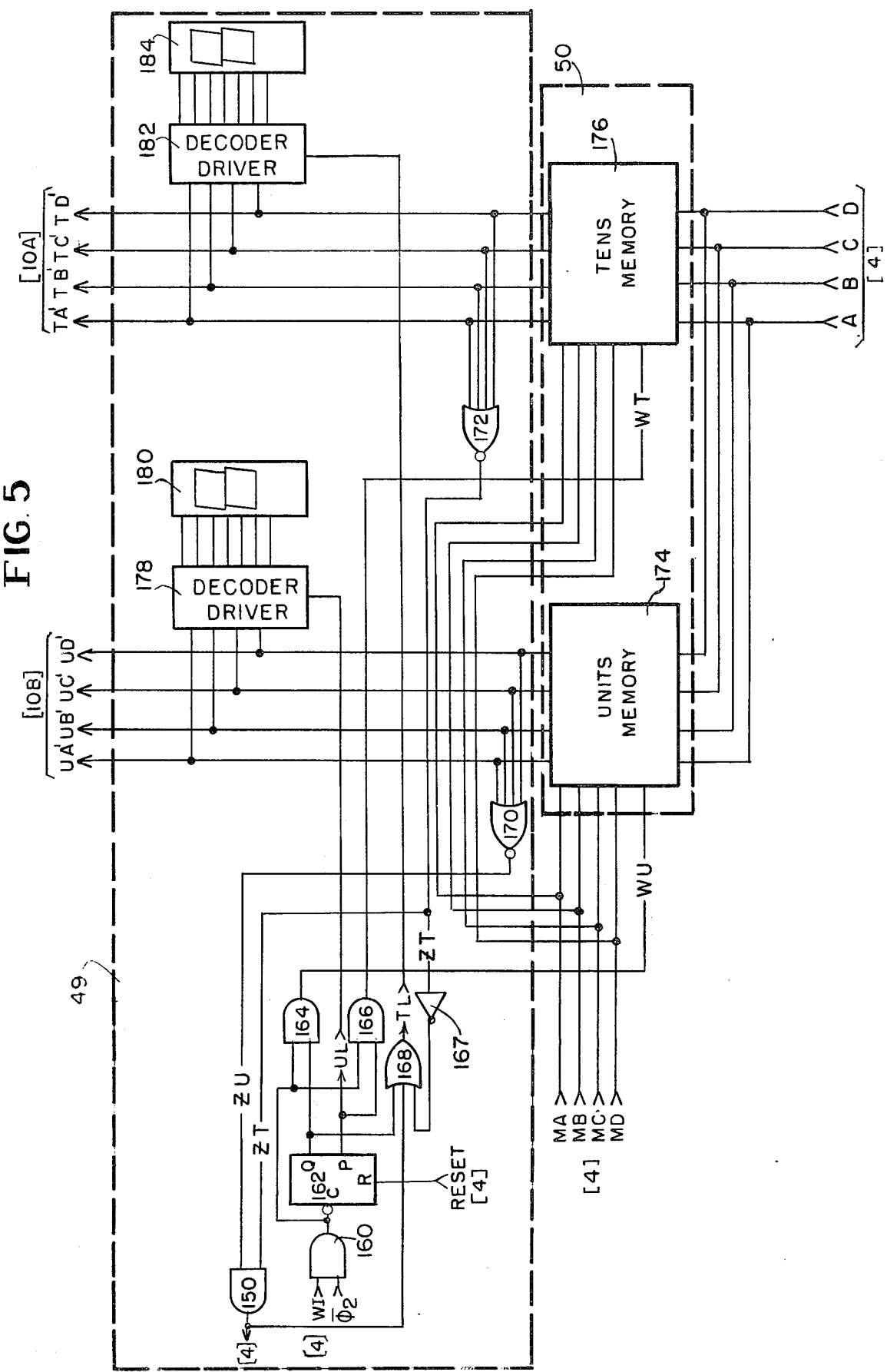
FIG. 5 shows the random access memory for the units and tens digits along with the corresponding decoding circuitry and display devices as contained in blocks 49 and 50 of FIG. 2.

Decode Display System 49 and Memory 50 (FIG. 5)

Decode display 49 comprises circuitry for identifying units and tens digits from keyboard 43, based on their order of entry, and for activation of the appropriate write-enable signals which permit information to be stored in the corresponding memory. The circuitry also controls blanking and illuminating of the channel number display in a manner which aids the viewer in utilizing the tuning system.

Memory 50 consists of circuitry providing 16 memory positions for recording two digit channel numbers represented by four bits each for the tens and units digits. The memory is shown in two portions, allowing separate write-in and read-out of units and tens channel digit information. Counter 142 of address counter 48 (FIG. 4) designates the address of a memory position in both memories. The signal levels at the outputs of the counter activate the common memory address inputs. The signal levels on leads A, B, C and D are applied to the memories but are not effective until a write-enable signal is received. The write-enable signal serves to guard the memory inputs from spurious signals. The memory outputs are not quarded and stored channel information at the designated position is always available.

The WI pulse signal generated at the output of AND 136 (FIG. 4) is applied along with the $\bar{\phi}_2$ timing signal from the clock pulse generator to the inputs of an AND 160. The output of AND 160 is connected to a clock terminal (C) of a flip-flop 162 and to one input each of an input of an AND 164 and of an AND 166. The Q output of flip-flop 162 connects to the second input of AND 164 and to one input of an OR 168. The P output of flip-flop 162 supplies a units display control signal, labelled UL, which is coupled to decoder divider 178 and to the second input of AND 166. The output of AND 164, labelled WU, connects to units memory 174 and the output of AND 166, labelled WT, connects to tens memory 176. The WU and WT signals correspond to the write commands for the units and tens memories, respectively. These signals assume a 1 level when permitting writing into the memories and a 0 level when preventing writing into the memories.

The output of a NOR 170, labelled ZU, is connected to one input of an AND 150. The output of a NOR 172, labelled ZT, is connected to the second input of AND 150 and, through an inverter 167, to the second input of OR 168. As mentioned in the previous discussion of FIG. 4, the output of AND 150 connects to the second input of OR 148. It is also connected to the third input of OR 168. The output of OR 168, labelled TL, connects to decoder driver 182 to provide control of the tens display 184. A UL and TL signal level of 1 enables display of the respective units and tens digits while a 0 signal level causes blanking.

Units memory 174 and tens memory 176 are connected to the leads A, B, C and D bearing the binary coded signals from the keyboard. Leads MA, MB, MC and MD from address counter 142 in FIG. 4 comprise the address leads for both memories. Units memory 174 has output leads UA', UB', UC' and UD' connected to NOR 170 for supplying the ZU signal and tens memory 176 has output leads TA', TB', TC' and TD' connected to NOR 172 for supplying the ZT signal. The ZU and ZT leads indicate the presence of 0000 in the memories. Thus, when the stored channel number includes a 0 units or tens digit, the corresponding ZU or ZT lead is at a 1 level.

Decoder driver 178 is also connected to the output leads of units memory 174 and drives a display device 180 for visually displaying the units digit. Similarly, the output leads of tens memory 176 are coupled to a decoder driver 182 which, through its display device 184, permits visual display of the tens digit. Any appropriate combination of decoder driver and display device may be used. Suitable units are manufactured by the Sperry Corporation under the model numbers DD700 and SP752, respectively.

In an actual embodiment of the tuning system incorporating the invention, eight 4-word by 8-bit capacity memory modules, similar to RCA CD 4036 AE are employed. The memories are used in a 4-word by 4-bit configuration to allow separate access to the units and tens digits. Four such memory modules are combined to provide the 16 units memory positions and four more are combined to provide the 16 tens memory positions. It is obvious that many other standard components may be selected and appropriately arranged to provide the same memory capacity and accessibility, and the memory itself, as distinct from the means incorporating it into the tuning system, is not part of the present invention.

A simple memory may consist of a rotatable magnetically coated drum with separate read and write heads for units and tens information. When an appropriate signal is received, the heads may be energized to locally magnetize small areas of the drum to store a "1" or "0" level by the state of magnetization. The rotation of the drum may be angularly "detented" to provide discrete memory positions, each of which is addressable by a drum rotator or counter. In the present tuning system four read and write heads are needed for each digit and the drum would be detentable in 16 angular positions under control of the address counter. The binary information would always be read by the read heads and only changed by the write heads.

An alternative standard memory unit which is easily adaptable to the preferred embodiment is a type SN 7489 64-bit read/write memory manufactured by Texas Instruments, Inc. This device, as described in Bulletin No. DL-S 7211386, February, 1971 - revised December, 1972, allows 16-word by 4-bit storage with a 4-bit data input, 4-bit address input selection and memory enable and write enable signal leads. Thus, one such device may be used for units memory 174 and one for tens memory 176. The minor modifications to the SN 7489 memory are as follows: the memory enable input must be maintained at a 0 level; an inverter must be added to the write enable input so that the WU or WT write enable signals produce zero level enable pulses; and the 4 sense outputs from this device must each be inverted so that there is a correspondence with the binary coding employed for the memory data input which is the standard binary representation.

Flip-flop 162 is a two state device which distinguishes tens from units digits based on their order of entry at the keyboard. Whenever a number is entered, it will be recalled that a 1 level WI pulse signal is generated. This, together with a 1 level $\bar{\phi}_2$ pulse (during the compare interval) at the input of AND 160 provides a 1 level output pulse to flip-flop 162. The trailing edge of this latter pulse changes the state of the flip-flop. Flip-flop 162 may also receive a RESET signal from the output of OR 132 in FIG. 4 which will cause it to assume a particular state so that the next digit received will be treated as a tens digit. The state of the flip-flop is determined by the signal levels at its Q output and P outputs. For the first state, the Q output is 0 and correspondingly the P output is at 1, while the second state has the reverse relationship. It will be recalled from the discussion of FIG. 4 that the RESET signal is produced only by entry of an UP or Down command at keyboard 43. When such a command is given, flip-flop 162 has its P output at a 1 level and is in its first state ready for entry of a tens digit.

The channel number displays operate in a predetermined sequence in response to entry of successive digits. The tens display is blanked for all complete channel numbers less than 10 and the units display is blanked whenever a tens digit is entered. This arrangement serves as a valuable tuning aid for the viewer. Blanking of the tens display avoids a non-standard tens-position 0 for channel numbers less than 10. Thus, while channel 2 is entered at the keyboard as 02, it is displayed as 2.

The units display is blanked immediately after entry of a tens digit to inform the viewer that the selection process is incomplete. This arrangement is advantageous since a channel number is entered one digit at a time, with the first or tens digit being displayed on the left and the second or units digit being displayed on the right. Thus blanking of the units display upon entry of a tens digit informs the viewer that only a single (tens) digit has been entered. Entry of a units digit completes the desired tuning and the display shows the entered channel number. For example, if channel 21 is being displayed and the viewer wishes to change tuning to channel 73, entry of the tens digit 7 results in the tens display reading 7 and the units display being blanked (for reasons that will be described later, the system actually tunes to channel 71 because of its fast response time). Upon subsequent entry of the units digit 3, the system tunes to and displays channel number 73.

The units display is directly controlled by the UL signal from the P output of flip-flop 162. When P is at 1 (first state of flip-flop 162) the units digit is displayed. Upon entry of a first (tens) digit, the WI signal (through AND 160) drives flip-flop 162 to its second state; P is now at 0 and the units display is blanked. Upon entry of a second (units) digit, flip-flop 162 resumes its first state (P at 1) and enables display of the units digit. The tens digit is blanked when all inputs of OR 168 are at 0. This condition is met when flip-flop 162 is in its second state (Q at 0), ZT is at 1 and either ZU or ZT is at 0.

Leads A, B, C and D are directly connected to units memory 174 and to tens memory 176. If the keyboard input is a command, no WI pulse signal is produced, neither memory receives a write enable (WU or WT) signal, and the information on the leads is not stored in the memory. However, counter 142 always "addresses" a memory position to which the tuning system responds (by tuning to the frequency corresponding to the channel number information stored at that memory position). Entry of a digit produces a WI pulse signal, which in the operate mode automatically results in address counter 142 assuming its 0000 count (scratch pad memory position) and, depending upon the WU and WT signal levels, writes the information into the appropriate memory by overwriting any previously stored information. Thus the memory is "loaded" or written into only when the WU or WT signal is at 1, as determined by flip-flop 162.

Band Decoder 52 (FIG. 6)

FIG. 6 shows band decoder 52 which determines the appropriate frequency band of the binary encoded channel numbers in the memory. The frequency band determination is necessary to insure that the correct preset information is supplied to the counters. A separate binary coding of leads BA and BB is used to designate the four channel bands (see Table 2 of FIG. 11). Tens memory leads TB', TC' and TD' are connected to the inputs of an OR 200, the output of which is connected to one input of an OR 202 and, through an inverter 203, to one input of an AND 204 and one input of an AND 206. Lead TA' is connected to a second input of AND 204, a second input of OR 202 and, through an inverter 208, to a second input of AND 206.

Units memory lead UD' is connected to an input of an AND 212 and, through an inverter 209, to one input of an AND 210. Lead UC' is connected to one input of an AND 214, one input of AND 216 and, through an inverter 211, to a second input of AND 210. Lead UB' is connected to a second input of AND 214 and lead UA' is connected to a second input of AND 216. The output of AND 210 is coupled to the third input of AND 204. The output of AND 214 connects to one input of an AND 220 and one input of an OR 218. The output of AND 216 is coupled to the second input of AND 220 and to a second input of OR 218. The output of AND 204 is connected to a third input of OR 218. The output of AND 206 is connected to the second input of AND 212 and back to the third inputs of AND 214 and AND 216. The output of AND 220 is connected to a third input of OR 202 and the output of AND 212 is coupled to the fourth inputs of OR 202 and OR 218. The output of OR 202 is labelled BA and the output of OR 218 is labelled BB, which correspond to the signals in Table 2 of FIG. 11.

A NAND 217 has one input connected to BA and its other input, connected through an inverter 215, to BB. Its output is coupled to switch means 302 (FIG. 8A) for selectively activating the UHF and VHF tuners and a 0 level signal output indicates a UHF channel, whereas a 1 level output indicates a VHF channel.

The operation of the band decoder is as follows. The output OR 200 is at 0, only when TB', TC' and TD' are all at 0, corresponding to the binary condition 000X, which restricts the tens digit to the range of 2 to 9. Thus, the output of OR 200 is at 1 for channel numbers 20 to 99 and is at 0 for channels 0–19.

The AND 210 output is at 1 when both UD' and UC' are at 0 corresponding to binary 00XX (a decimal range of 0 through 3) for the units digit. The outputs of AND 204 is at 1 when OR 200 is at 0, TA' is at 1 (only for an odd tens digit) and AND 210 is at 1. Hence the channel number must be between 0 and 19 and have an odd tens digit and a units digit between 0 and 3. Thus, the output of AND 204 is at 1 whenever the channel number is 10 through 13.

AND 206 is at 1 if both TA' and OR 200 are at 0, corresponding to a channel number from 0 to 19 with an even tens digit (zero is even). Thus, the output of AND 206 is at 1 when the channel number is 0 through 9.

The output of AND 214 is at 1 when AND 206 is at 1 and UB' and UC' are at 1. The first condition is satisfied for channels 0 through 9 and UB' and UC' at 1 corresponds to a units binary X11X. All conditions are satisfied only for numbers 6 and 7 and the output of AND 214 is at 1 only for channels 6 and 7.

AND 216 is at 1 for channel numbers 0 through 9 and UA' and UC' at 1 (binary X1X1). Only numbers 5 and 7 satisfy the conditions and the output of AND 216 is at 1 only for channel numbers 5 and 7. It follows that the output of AND 220 is at 1 when AND 216 and AND 214 are at 1 which only occurs for channel number 7.

The output of AND 212 is at 1 for UD' at 1 (binary 1XXX — units digit 8 or 9) and the channel number is 0 through 9. Only numbers 8 and 9 satisfy these conditions and the output of AND 212 is at 1 for channel numbers 8 and 9.

The output of OR 202 (BA) is at 0 only when all inputs are at 0, corresponding to: numbers 0–19; an even tens digit; not a 7; and not an 8 or 9. Thus for channel numbers 0–6, BA is 0 and for channels 7–99, BA is at 1.

Similarly the output of OR 218 (BB) is at 0 only when all its inputs are at 0 corresponding to: not 5–7; not 6–7; not 8–9; and not 10–13. Thus it is at 0 for all but numbers 5–13. For all other channel numbers BB is at 1. From Table 2 of FIG. 11 it may be seen that BA and BB may be encoded into signals B1–B4 for unambiguously specifying the four frequency bands.

Figure 7:
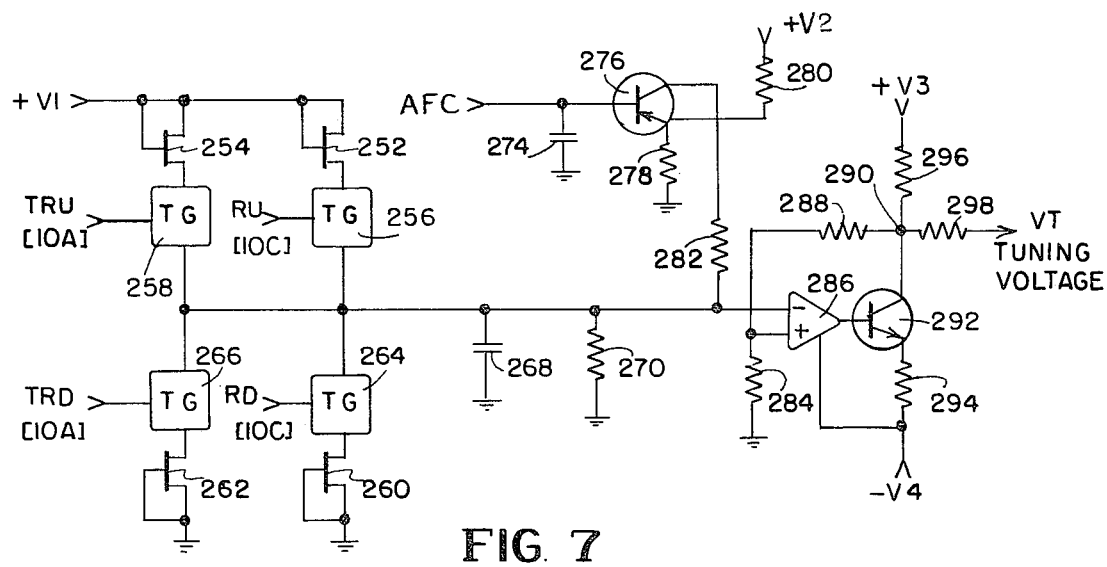
FIG. 7 shows circuitry of the ramp voltage generator in block 68 of FIG. 2 which is used to drive the varactor tuner.

Ramp Voltage Source 68 (FIG. 7)

Referring now to FIG. 7, ramp voltage source 68 is supplied information as to the state of the comparator and produces appropriate voltages for adjusting the tuner by selective activation of a plurality of transmission gates coupled to appropriate current sources and sinks. Ramp source 68 has two "tuning speeds" or voltage characteristics, with a higherr rate of voltage change occurring in response to an inequality in the tens comparator than for inequalities in the units or modular comparators. As will be seen, inequalities in the tens comparator activate both the tens and units gates for the high ramp speed, whereas for units and modular comparator inequalities, only the units gate is activated for the low speed ramp. The ramp voltage drives an operational amplifier for developing the actual tuning voltages. The polarity or ramp direction is determined by whether the comparator "signals for" an increase or decrease in tuning frequency.

A source of voltage +V1 is connected to the gate electrodes and source electrodes of a FET 252 and a FET 254. Their drain electrodes are connected respectively to the inputs of a pair of transmission gates 256 and 258. A pair of FET's 260 and 262 have their source and gate electrodes connected to ground and their drain electrodes connected respectively to the inputs of a pair of transmission gates 264 and 266. The outputs of transmission gates 256, 258, 264 and 266 are connected to one terminal of a turning capacitor 268, the other terminal being connected to ground. A resistor 270 is connected in parallel with capacitor 268.

A conventionally derived source of AFC voltage is supplied to the base of a transistor 276 which is coupled to ground through a capacitor 274. Another source of positive voltage +V2 is supplied across a voltage divider comprising a resistor 280 and a resistor 278. The junction of the divider connects to the emitter of transistor 276 and establishes proper operating bias. The collector of transistor 276 is connected through a resistor 282 to tuning capacitor 268, and to the negative input terminal of an operational amplifier 286. The positive input terminal of the operational amplifier is connected to ground through a resistor 284 and through a resistor 288 to a collector terminal 290 of a transistor 292. A source of positive voltage +V3 is applied through a resistor 296 to terminal 290. A source of negative voltage −V4 is supplied through a resistor 294 to the emitter of transistor 292. −V4 also supplies power to operational amplifier 286. The base of transistor 292 is supplied with the output signal of the operational amplifier and the tuning voltage for the varactor turner is taken from terminal 290, through a resistor 298. The transmission gates are well known in the art and a package of four such gates may be obtained under the RCA designation CD4016.

Each gate has a control terminal which is connected to the comparator. The control terminals of gates 256 and 264 are connected, respectively, to leads labelled RU and RD (ramp up and ramp down) in modular comparator 51C. The control terminals of gates 258 and 266 are connected, respectively, to signal leads labelled TRU (tens ramp up) and TRD (tens ramp down) in tens comparator 51A.

The transmission gates are activated by a 1 level signal on their respective control terminals. The gates supply capacitor 268 which substantially maintains its voltage until charge is added or removed. The tuning capacitor voltage is applied to the varactor tuner through operational amplifier 286 and transistor 292 thus enabling control with low voltage circuitry suitable for integrated circuit applications.

The ramp direction is up (higher tuning frequency desired) for energization of gates 256 and 258 and down for energization of gates 264 and 266. FET's 254 and 262 have higher current capabilities than their counterparts 252 and 260. When a TRU or TRD signal is produced, the corresponding RU or RD signal is also produced. Thus the high speed ramp involves activation of both transmission gates 256 and 258 for up and both 264 and 266 for down. On the other hand only an RU or RD signal is developed for differences in either the units or modular comparators. Thus the system produces a higher slope ramp voltage for differences in the tens comparator than for differences in the units and modular comparators. When equality is reached in comparator 51 all transmission gates are in the off state and the effect of the conventional AFC in making incremental voltage changes on capacitor 268 is felt.

The AFC voltage which varies as a function of the received signal IF frequency deviations is applied to the base of transistor 276 and exerts control on the voltage level of tuning capacitor 268. If the AFC voltage goes down, transistor 276 is turned on charging capacitor 268 through resistor 282 to raise the voltage at junction 290 through operational amplifier 286. If the AFC voltage increases, transistor 276 is turned off and charge is slowly leaked from the capacitor through resistor 270 to reduce the tuning voltage.

Figure 8B:
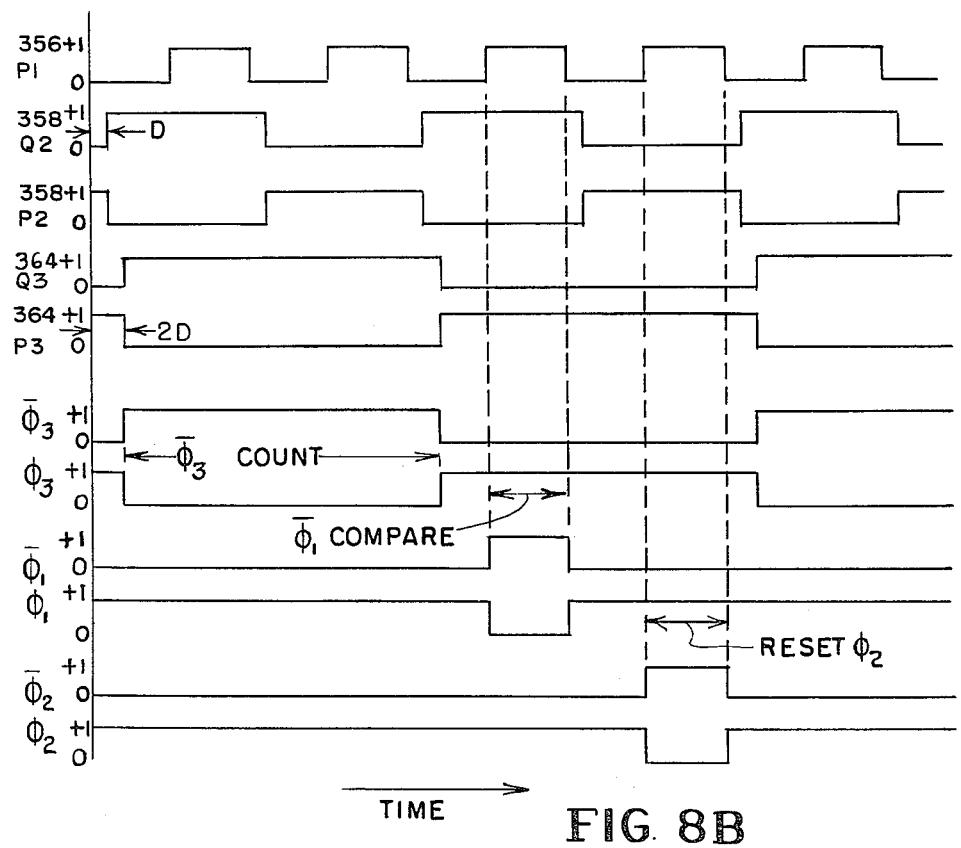
FIG. 8B is a graph showing the relationship between the timing sequence pulses and the clock pulse generator.
Figure 8A:
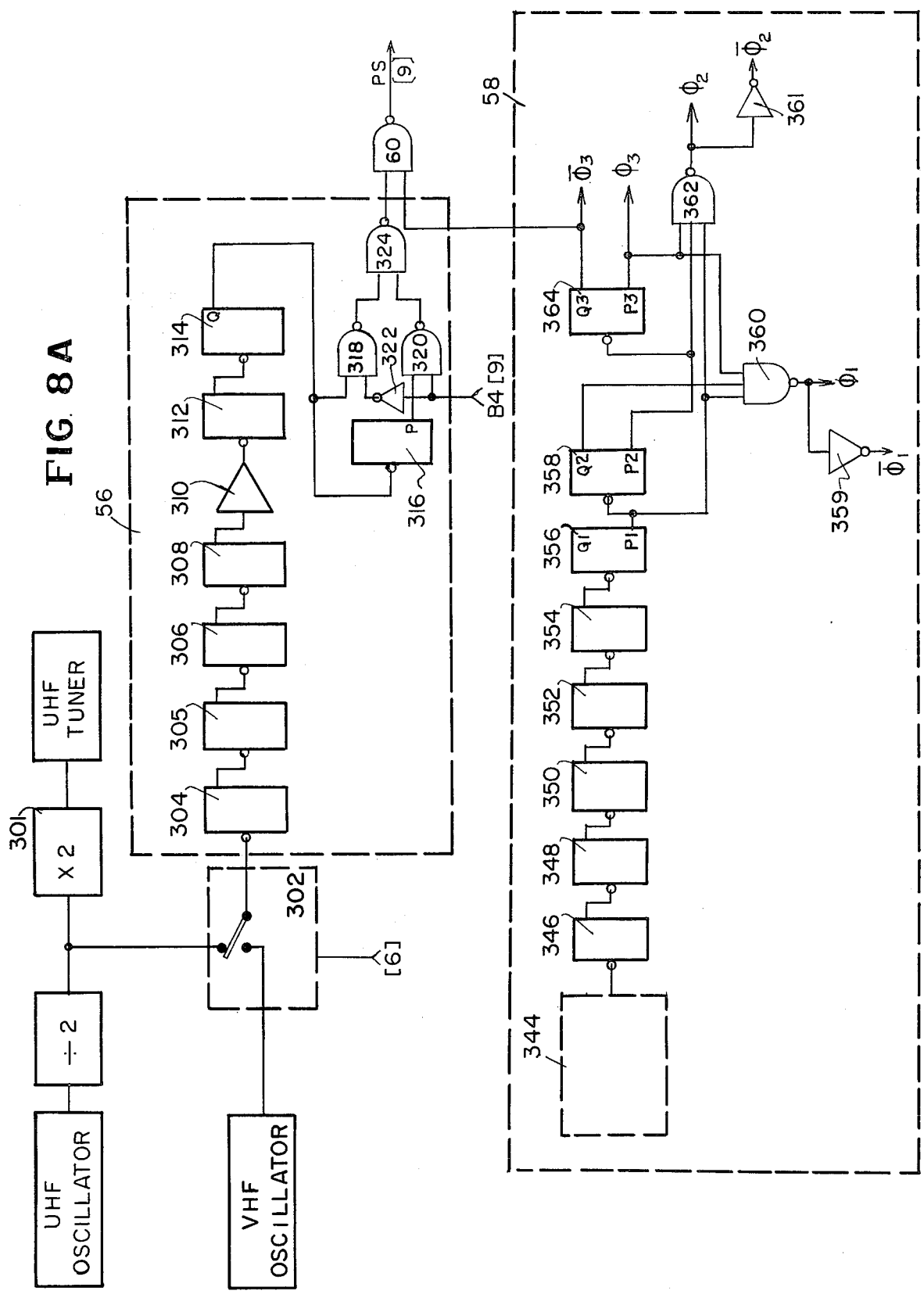
FIG. 8A shows the local oscillator frequency prescaler and the clock pulse generator contained in blocks 54, 56, 58 and logic gate 60.

Local Oscillator Frequency (LOF) Scaler 56 (FIG. 8A)

The output of the local oscillator (FIG. 8A) is supplied to a series of flip-flops interconnected to provide successive divide-by-2 operations. The UHF oscillator is subjected to a frequency division of 2, followed by a frequency multiplication of 2, before being coupled to the UHF tuner. The effect of the serially arranged divider and multiplier is, therefore, nil, but the one half frequency UHF oscillator output supplied to LOF scaler 56, is much more convenient to measure. In order to maintain the same time base for UHF and VHF operation, an additional divide-by-2 operation is incorporated when in the VHF mode.

The block diagram shows the UHF oscillator and the successive division/multiplication blocks 300 and 301. The junction of the blocks is connected to one fixed terminal of a switching means 302. The other fixed terminal of switching means 302 is connected to the VHF oscillator which operates at normal frequency. Switching means 302 is shown schematically as a simple switch but preferably comprises an electronic switch controlled by NAND 217 in band decoder 52 of FIG. 6.

The common terminal of switching means 302 is connected to a series of four flip-flops 304, 305, 306 and 308, arranged to form a divide-by-16 scaler. An operational amplifier 310 is connected between the output of flip-flop 308 and the input of flip-flop 312, which has its output connected to a flip-flop 314, thereby forming an additional divide-by-4 scaler. The Q output of flip-flop 314 is connected to one input of a NAND 318 and to the input of a flip-flop 316, the P output of which is connected to one input of a NAND 320. Lead B4 from the band decoder circuitry from modular scaler 62 (FIG. 9) is connected to the second input of NAND 320 and, through an inverter 322, to the second input of NAND 318. The output of NAND 318 and the output of NAND 320 are connected to the inputs of a NAND 324; the outputs of which provides one input to NAND logic gate 60 of FIG. 2. The second input to logic gate 60 is supplied with a timing pulse $\overline{\phi}_3$ from clock pulse generator 58. The output of logic gate 60 is a signal consisting of pulses PS for the modular scaler.

Each local oscillator cycle or pulse causes a change in state of flip-flop 304 and an appropriate 1 signal level on its output terminal. Thus, for every other oscillator pulse its output terminal is at 1 and drives flip-flop 305 to change its state. Two oscillator pulses therefore result in one output pulse from flip-flop 304 and a divide-by-2 operation has been performed. Subsequent flip-flops are arranged in the same manner with each providing a divide-by-2 action. Operational amplifier 310 is used merely to establish a desired voltage level to accommodate different types of integrated circuits, i.e., ECL and TTL (emitter coupled logic and transistor to transistor logic). One suitable operational amplifier for converting from ECL to TTL is manufactured by Fairchild Semiconductors, a Division of Fairchild Camera and Instrument Corp. under Model designation 9595.

Operation of the UHF oscillator at half frequency to supply the LOF scaler, while the VHF oscillator operation is at correct frequency, requires an additional divide-by-2 operation when the VHF tuner is activated so that all frequency comparisons are on the same basis. Flip-flop 316 serves this purpose and its P output is coupled to the second input of NAND 320. From Table 2 of FIG. 11, it may be seen that B4 is at 0 for all UHF channel selections, thus inhibiting NAND 320 so that flip-flop 316 has no effect and the inverted signal enables NAND 318. Conversely, lead B4 at 1 corresponds to VHF operation with NAND 318 inhibited by the inverted signal, NAND 320 enabled and flip-flop 316 providing the additional divide-by-2 operation.

Clock Pulse Generator 58 (FIG. 8A) and Timing Diagrams (FIG. 8B)

Clock pulse generator 58 develops the timing signals for the tuning system. It employs a reference oscillator whose output signal pulses are divided-down by a series of flip-flops to provide timing periods of desired lengths. Signal $\overline{\phi}_3$ at a 1 level determines the "count" interval, $\overline{\phi}_1$ at 1 the "compare" interval and $\overline{\phi}_2$ at 1 the "reset" interval. The $\phi$ signals are the opposite of the $\overline{\phi}$ signals, i.e., the 1 and 0 levels are interchanged.

A crystal oscillator means 344 has an output terminal supplying a 1 MHz reference signal. Means 344 may conventionally include a crystal controlled oscillator and appropriate circuitry for providing a 1 MHz square wave output. The output terminal is connected to a sequential arrangement of flip-flops 346, 348, 350, 352, 354 and 356. These six flip-flops comprise a divide-by-64 scaler for the 1 MHz output pulses. The P1 output of flip-flop 356 is coupled to the input of a flip-flop 358 and to one input each of a NAND 360 and of a NAND 362. The P2 output of flip-flop 358 is connected to the input of a flip-flop 364 and to a second input of NAND 362. The Q2 output of flip-flop 358 is connected to a second input of NAND 360. The Q3 output of flip-flop 364 supplies timing signal $\overline{\phi}_3$. The P3 output of flip-flop 364 supplies timing signal $\phi_3$ and is also connected to the third inputs of NAND 360 and NAND 362. The output of NAND 362 supplies timing signal $\phi_2$ which, when passed through an inverter 361, forms timing signal $\overline{\phi}_2$. Similarly the output of NAND 360 supplies timing signal $\phi_1$ which, when passed through an inverter 359, forms timing signal $\overline{\phi}_1$.

To prevent the simultaneous occurrence of the timing intervals NAND gates 360 and 362 have one input terminal supplied with $\phi_3$ and are inhibited when $\phi_3$ is at a 0 level during a count interval ($\overline{\phi}_3$ at 1). Thus no compare ($\overline{\phi}_1$ at 1) or reset ($\overline{\phi}_2$ at 1) timing intervals occur during a count interval.

FIG. 8B shows the Q and P output terminals of the flip-flops directly involved in generating the timing signals and the corresponding timing signal waveforms, as a function of time. The normal square waveform observable at the P1 terminal of flip-flop 356 is shown, with the 1 to 0 transition for the P1 terminal selected as the starting point. The D and 2D displacements result from the time delays involved in switching from one flip-flop to the next. The "Q"and "P" terminal signals are inversions of each other.

When timing signal $\overline{\phi}_3$ is at a level, the count interval is defined. This occurs when the Q3 terminal of flip-flop 364 is at 1. Since $\phi_3$ is then at 0, $\phi_1$ and $\phi_2$ are at 1 and consequently $\overline{\phi}_1$ and $\overline{\phi}_2$ are at 0. The 1 level of signal $\overline{\phi}_1$ is developed at the output of inverter 359 when the output of NAND 360 is at 0. This occurs when P1 of 356, Q2 of 358 and P3 of 364 are all at 1. Under these three conditions, $\phi_1$ is at 0 and $\overline{\phi}_1$ is at 1, defining the compare interval. A 1 level $\overline{\phi}_2$ timing signal is produced at the output of inverter 361, when the output of NAND 362 is at 0. This occurs when P1 of 356, P2 of 358 and P3 of 364 are all at 1. Under these conditions, the output of NAND 362 is at 0, ($\phi_2$ is at 0) and $\overline{\phi}_2$ is at 1, defining the reset interval. As mentioned, NAND 360 and NAND 362 each have an input supplied by opposite terminals of 358 and the compare and reset timing intervals can never coincide.

During the $\overline{\phi}_3$ count interval the local oscillator is interrogated to determine its frequency by counting pulses in the modular scaler and tens and units counters. The count interval is a series of 1 level clock pulses, each 128 microseconds long, occurring at a rate of 3906 Hz and not coincident with the $\overline{\phi}_1$ compare and reset intervals.

During the $\overline{\phi}_2$ reset interval the modular scaler and tens and units counters are preset for the next counting operation. This interval is a series of 1 level clock pulses, each 32 microseconds long, occurring at a rate of 3906 Hz and not coincident with the other intervals.

During the $\overline{\phi}_1$ compare interval the comparator which is making a continual comparison between the derived channel number and the desired channel number is interrogated. This interval is a series of 1 level clock pulses of 32 microseconds occurring at a rate of 3906 Hz.

Figure 9:
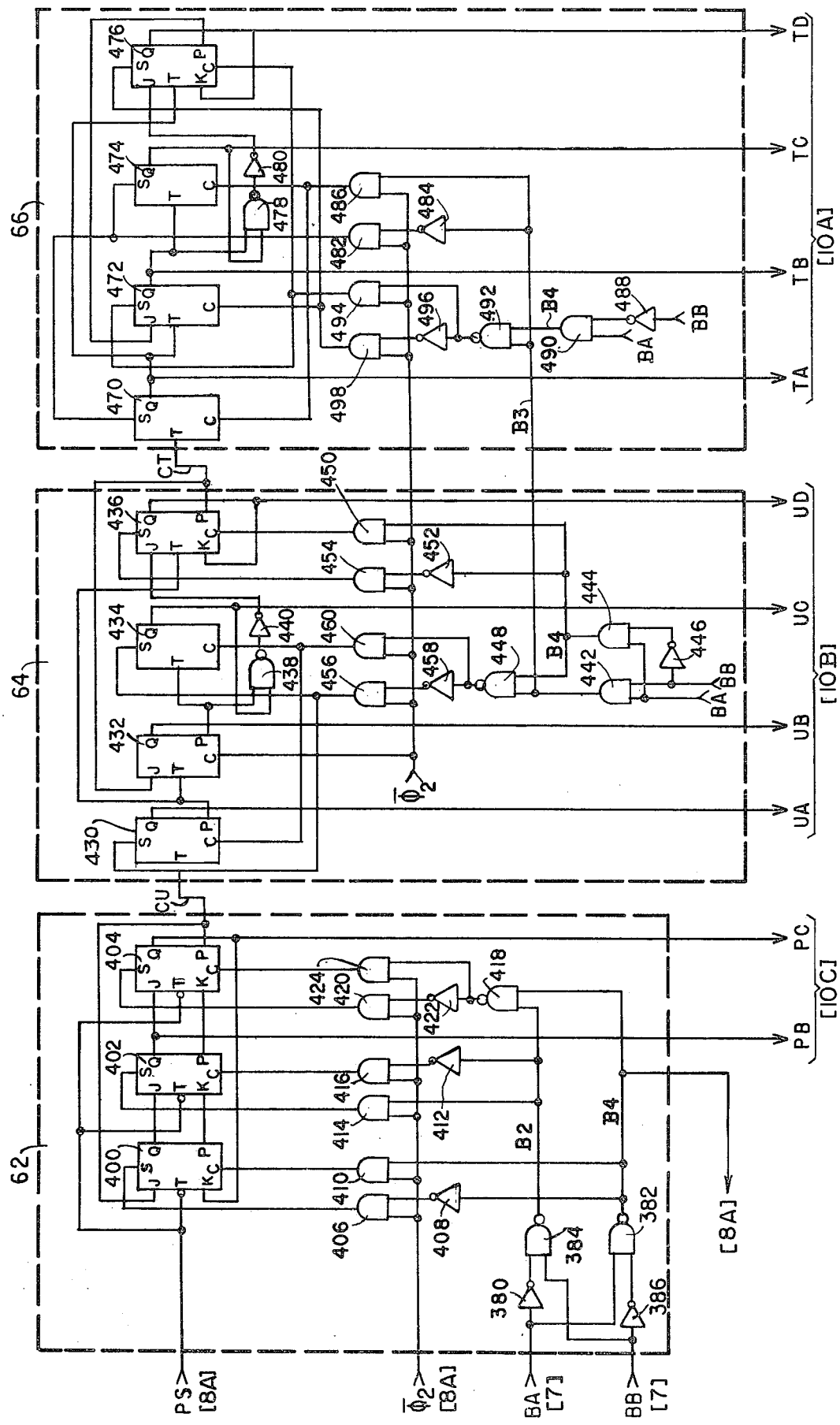
FIG. 9 shows the modular scaler and the units and tens counter contained in blocks 62, 64 and 66 of FIG. 2.

Modular Scaler 62 (FIG. 9)

Modular scaler 62 in conjunction with the units and tens counters determines the number of PS pulses during a count interval. With the appropriate presets on the counters, this arrangement derives the corresponding channel number and intrachannel fractions. The residue count in the modular scaler is subsequently used to define the window for determining when the tuner is tuned to the appropriate intrachannel fractional location.

The modular scaler consists of three JK type flip-flops appropriately connected to provide modular 6 arithmetic countering. It also includes logic circuitry for decoding the appropriate band signals to produce the proper presets for developing the correct residue for comparison with the predetermined residues in the comparator.

The BA and BB leads from band decoder 52 are applied to decoding circuitry. Lead BA is connected to one input of a NAND 382 and, through an inverter 380, to one input of a NAND 384. Lead BB is connected to the second input of NAND 384 and, through an inverter 386, to the second input of NAND 382. A 0 at the output of NAND 384 corresponding to a selected channel in band 2 and a 0 at NAND 382 corresponds to band 4. (See Table 2, FIG. 11.) B2 and B4 1 level signals indicate that the selected channel is in Bands 1 or 3 (which have the same preset information).

The JK flip-flops are designated as 400, 402, 404. The PS signal from NAND 60 is supplied to the T terminal of each of the three flip-flops. The Q and P terminals of flip-flop 400 are connected respectively to the J and K terminals of flip-flop 402. Similarly, the Q and P terminal of flip-flop 402 are connected to the J and K terminals of flip-flop 404. The J terminal of flip-flop 400 is connected to the P terminal of flip-flop 404, which is labelled CU. The K terminal of flip-flop 400 is connected to the Q terminal of flip-flop 404 which is labelled PC. The Q output of flip-flop 402 is labelled PB.

The B4 lead is connected to one input of an AND 410, one input of a NAND 418, through an inverter 408, to one input of an AND 406 and to the LOF scaler in FIG. 8A. The B2 lead is connected to one input of an AND 414, one input of a NAND 418 and, through an inverter 412, to the second input of an AND 416. The output of NAND 418 is connected to one input of AND 424 and, through an inverter 422, to one input of an AND 420. Timing signal $\overline{\phi}_2$ is supplied to the second inputs of AND 406, AND 410, AND 414, AND 416, AND 420 and AND 424, for enabling these gates during the reset interval. The output of AND 406 and the output of AND 410 are connected respectively to the set (S) and clear (C) terminals of flip-flop 400. The output of AND 414 and the output of AND 416 are connected respectively to the S and C terminals of flip-flop 402. Similarly, the outputs of AND 420 and AND 424 are connected respectively to the S and C terminals of flip-flop 404.

The modular scaler is thus seen to consist of three flip-flops, interconnected to form a Johnson Counter. A Johnson counter has six states and the signals at the Q outputs of the flip-flops thereof are listed in FIG. 11, Table 4 for each state. The number of PS pulses in the $\overline{\phi_3}$ count interval is representative of the local oscillator frequency. The state preset information for the modular scaler and the decimal presets for the units and tens counters are shown in Table 5 of FIG. 11. For each PS pulse, the counter advances one state and when the Johnson counter experiences a transition (state six to state 1) a pulse CU is delivered to the units counter. As described earlier in the discussion of the window, two adjacent residues are selected for the modular scaler to define the window. For all bands, these residues correspond to states 4 and 5 in the Johnson counter.

Assume channel 2 is desired and 02 is entered at the keyboard. Since, as will be seen, the comparator will show an inequality, a ramp signal is generated for changing the tuning of the tuner. The input channel number is decoded in the band decoder and leads BA and BB are at 0 (Table 2). Thus both B2 and B4 are at 1. Assuming a $\overline{\phi_2}$ timing signal at 1 (reset), AND 410 is enabled and clears flip-flop 400. A cleared flip-flop has its Q output at 0. B2 at 1 enables AND 414 and flip-flop 402 is set. A set flip-flop has its Q output at 1. B2 and B4 at 1 result in the output of NAND 418 being at 0, which enables AND 420 and sets flip-flop 404. The Q outputs of flip-flops 400, 402 and 404 are at 0, 1 and 1, respectively. From Table 4, this corresponds to state 5, which from Table 5 is the correct modular state preset for band 1.

Assume tuning is complete for channel 2. During each $\overline{\phi_3}$ count interval 101 PS pulses are supplied to modular scaler 62. Modular division of 101 by 6 (the number of pulses required to cycle the Johnson counter) results in 16R5. Because the counter was preset to state 5, the remainder of 5 pulses drives the counter to state 4 (causing an additional state 6 to state 1 transition in the process). Thus, 17 transitions of the Johnson counter from state 6 to state 1 occur causing a like number of CU pulses. The final status or residue of the counter is state 4, which was previously indicated as an acceptable residue. Because of the asynchronous counting system, however, 102 PS pulses could be supplied to the modular scaler during the $\phi_3$ count interval when the tuner is tuned to channel 2. This would result in the Johnson counter ending in state 5 which is also acceptable.

As another example assume channel 14 is selected. B2 is at 1 and B4 is at 0. B4 at 0 enables AND 406 which sets flip-flop 400. B2 at 1 enables AND 414 and sets flip-flop 402. B2 and B4 at 1 and 0, respectively, result in a 1 level output signal from AND 418 which enables AND 424 and clears flip-flop 404. The Q outputs of flip-flop 400, 402 and 404 are respectively 1, 1 and 0, corresponding to state 3. From Table 5, a channel in band 4 has a modular state preset of 3.

When the tuner is tuned to channel 14, its local oscillator frequency is represented by 517 PS pulses. Modular division by 6 results in 86R1. Since the Johnson counter is preset to state 3, the remainder of 1 causes a further advance to state 4 which is acceptable. Similarly because the system gating is asynchronous, 518 PS pulses may be received during a count interval, resulting in a final state of 5, which is also acceptable. Under these conditions, 86 CU pulses are sent to the units counter.

Units Counter 64 (FIG. 9)

Units counter 64 of FIG. 9 comprises a series of four JK flip-flops which are presettable so that in conjunction with the CU transition pulses from the modular scaler its status represents in standard binary form, the units value of the derived channel number. For each units counter transition, represented by the counter advancing from 9 to 0 (in decimal notation), a CT pulse is delivered to the tens counter.

The CU pulses from modular scaler 62 are applied to the T terminal of the flip-flop 430, to Q terminal of which is labelled UA. Its P terminal is connected to the T terminals of a flip-flop 432, and a flip-flop 436. The J terminal of flip-flop 432 is connected to the P terminal of flip-flop 436, labelled CT. The Q terminal of flip-flop 432 is labelled UB, and the P terminal is connected to the T terminal of a flip-flop 434 and one input of a NAND 438. The Q output of flip-flop 434 (labelled UC) is connected to the second input of NAND 438. The output of NAND 438 is connected, through an inverter 440, to the J terminal of flip-flop 436, the Q terminal of which (labelled UD) is connected to its K terminal. UD, UC, UB and UA correspond to the standard binary representation of the units counter status.

The band decoder output BA is applied to one input of a NAND 442 and to one input of a NAND 444. Band decoder output BB is applied to the second input of NAND 442 and through an inverter 446 to the second input of NAND 444. A 0 signal level at the output of NAND 442 (B3) corresponds to a channel number in the third frequency band and this output is connected to one input of a NAND 448. Similarly, a 0 signal level at the output of NAND 444 (B4) designates a channel number in the fourth frequency band an this output is connected to the second input of NAND 448, to one input of an AND 450 and, through an inverter 452, to one input of an AND 454. The output of NAND 448 is connected to one input of an AND 460 and, through an inverter 458, to one input of an AND 456. Timing signal $\overline{\phi_2}$ is applied to the C terminal of flip-flop 432 and to the second inputs of AND 456, AND 460, AND 454 and AND 450, thus clearing 432 and enabling those gates during the reset interval.

The output of AND 456 is connected to the S terminals of flip-flop 430 and flip-flop 434. The output of AND 460 is connected to the C terminals of these flip-flops. The output of AND 450 and AND 454 are connected respectively to the C and S terminals of flip-flop 436. No connection is made to the S terminal of flip-flop 432 since it doesn't receive a preset for any band.

Assume channel 2 is entered at the keyboard, and $\overline{\phi_2}$ is at 1, defining the reset interval. Channel 2 is in band 1, and from Table 5 of FIG. 11, B3 and B4 are at 1. The output of NAND 448 is, therefore, at 0 and by virtue of inverter 458, results in both inputs of AND 456 being at 1. Thus flip-flops 430 and 434 are set. Note that $\overline{\phi_2}$ at a 1 level clears flip-flop 432. Since B4 is also at 1, AND 450 clears flip-flop 436 and the Q outputs of flip-flops 436, 434, 432 and 430 respectively, are 0101 (UD, CU, UB, UA) which corresponds to a binary representation of decimal 5. Thus entry of a band 1 channel results in a preset of 5 in the units counter.

As discussed for modular scaler 62, for channel 2, 17 CU pulses are delivered to the units counter. With a preset of 5, the 17 pulses cause two 9 to 0 transitions in the units counter resulting in a count status of decimal 2 and 2 CT pulses being sent to the tens counter.

Similarly, upon entry of channel 14, B3 and B4 are at a 1 level and a 0 level respectively. The output of NAND 448 is at 1 enabling AND 460 which clears flip-flops 430 and 434. The $\bar{\phi}_2$ reset signal clears flip-flop 432. B4 at 0, via inverter 452, enables AND 454 which sets flip-flop 436. The status of flip-flops 436, 434, 432 and 430 is respectively 1000 (UD, UC, UB, UA), which is the binary representation of decimal 8. From Table 5, the units preset condition for band 4 is 8.

An input of channel 14 results in 86 CU pulses to the units counter. With a preset of 8, 86 added pulses result in a units counter status of decimal 4, with nine transition pulses (CT) being sent to the tens counter.

Tens Counter 66 (FIG. 9)

Tens counter 66 consists of four presettable JK flip-flops driven by the CT pulses from the units counter for developing a binary representation of the tens digit of the derived channel number.

The CT pulses are applied to the T terminal of a flip-flop 470, the Q output of which is connected to the T terminals of a flip-flop 472 and a flip-flop 476. The Q terminal of flip-flop 470 is labelled TA. The Q output of flip-flop 472, labelled TB, is connected to the T terminal of a flip-flop 474 and to one input of a NAND 478. The Q output of flip-flop 474 is labelled TC and is connected to the second input of NAND 478. The output of NAND 478 is connected, through an inverter 480, to the J terminal of flip-flop 476. The Q and K terminals of flip-flop 476 are interconnected and are labelled TD. TD, TC, TB, TA correspond to the standard binary representation of the counter status.

The B3 signal from NAND 442 in units counter 64 is supplied as one input to a NAND 492, to one input of an AND 486 and, through an inverter 484, to one input to an AND 482. The B4 signal is separately derived from the output of an AND 490. BA is supplied as one input to NAND 490 and BB, through an inverter 488, as its second input. B4 is connected to the second input of NAND 492. The output of NAND 492 is connected to one input of an AND 494 and, through an inverter 496, to one input of an AND 498. Timing signal $\bar{\phi}_2$ is supplied to the second inputs of AND 498, AND 494, AND 482 and AND 486, thus enabling these gates only during the reset interval. The output of AND 482 is connected to the S terminals of flip-flops 470 and 474. The output of AND 486 is connected to the C terminals of flip-flops 470 and 474. The J terminal of flip-flop 472 is connected to the P terminal of flip-flop 476. The output of AND 494 is connected to the S terminal of flip-flop 472 and to the C terminal of flip-flop 476 and output of AND 498 is connected to the C terminal of flip-flop 472 and to the S terminal of flip-flop 476.

Using the example of Channel 2 results in B3 and B4 both being at 1. (Also assume $\bar{\phi}_2$ is at 1 defining the reset interval.) The output of NAND 492 is at 0, which, when applied through inverter 496, enables AND 498 for clearing flip-flop 472 and setting flip-flop 476. B3 at 1 enables AND 486 which clears flip-flop 470 and 474. The resulting status of flip-flops 476, 474, 472, and 470 as represented by their Q outputs is binary 1000 (TD, TC, TB, TA), corresponding to decimal 8. From Table 5 it is seen that the tens preset for a channel in band 1 is 8. As discussed above, for channel 2, two CT pulses are supplied from the units counter. These two CT pulses, when added to the decimal 8 preset result in a count status of 0. Therefore, the final status of the tens counter for channel 2 is 0.

Channel 14 is in band 4 with B3 at 1 and B4 at 0. The output of NAND 492 is at 1, enabling AND 494 which sets flip-flop 472 and clears flip-flop 476. B3 at 1 enables AND 486 which clears flip-flops 470 and 474. The resulting status of flip-flops 476, 474, 472 and 470 is binary 0010 (TD, TC, TB, TA) corresponding to decimal 2. From Table 5, the tens preset for a channel in band 4 is 2.

For channel 14 the units counter delivered 9 CT pulses to the tens counter. With a preset of decimal 2, the addition of 9 pulses causes a 9 to 0 transition and the resulting status is 1. As the tuning system need only process two digit channel numbers, no provision is made for recording transitions of the tens counter. The result is decimal 1 which is the correct tens counter status for channel number 14.

Tens Comparator 51A (FIG. 10A)

FIG. 10A shows the tens comparator circuitry which compares the binary representation of the tens digit of the derived channel number in the counter with the binary representation of the tens digit of the channel number in the memory. It is a sequential bit comparator having four bit comparison stages with each stage comprising two AND gates (one each for the counter and the memory) with their outputs coupled to a NOR gate. One AND is supplied with a signal from the counter and an inverted signal from the memory and the other AND is supplied with a signal from the memory and an inverted signal from the counter. The output signal of the counter AND gate in each stage is also supplied as an input signal to one of the four inputs of a tens counter OR gate. Similarly, the output signal of the memory AND gate in each stage is supplied as an input signal to one of the four inputs of a tens memory OR gate. When either the counter or memory OR gate is inhibited it produces a 1 level output which indicates that its binary bit string is greater in magnitude (represents a larger decimal number) than the other. The tens memory OR and tens counter OR produce a tens ramp up (TRU) and tens ramp down (TRD) signal, respectively, for direct application to the appropriate tens transmission gate in ramp generator 68. The TRD and TRU signals are also supplied to the units comparator, along with a tens ramp equal (TRE) signal.

Tens comparator 51A sequentially performs a bit-by-bit comparison of the tens digits beginning with the most significant binary bit (TD, TD') and ending with the least significant binary bit (TA, TA'). If the comparison between corresponding bits in the most significant stage results in a determination of inequality with, for example, the counter being high, an inhibiting control signal is sent to one input of the counter OR, which results in a ramp down control voltage (TRD). If equality is determined, one input of both OR gates is enabled and further control of the gates is transferred to the next bit stage of the comparator; by the NOR gate of the stage enabling the AND's and the NOR of the next stage. It is this sequential mode of comparison, achieved by inhibiting the AND's and NOR of subsequent stages until equally exists in the higher order stages, which determines the direction of the difference in the tens binary bit and, therefore, the direction of the ramp control voltage developed in voltage source 68.

The tens comparator also includes a three state triflop for indicating that the corresponding binary signal from the tens counter is greater than, less than, or equal to the corresponding binary signal from the tens memory. The tip-flop functions to interrogate the tens comparator during the compare interval and remains in its last determined state until another comparison has been made.

In the first stage, TD (from tens counter 66) is connected to an input of a first stage AND 500 and, through an inverter 502, to an input of a first stage AND 504. TD' (from tens memory 176) is connected to the second input of AND 504 and, through an inverter 506, to the second input of AND 500. A 1 level output signal from AND 500 is obtained when TD is at 1 and TD' is at 0, while a 1 level output signal from AND 504 is obtained when TD is at 0 and TD' is at 1. TD at 1 corresponds to binary 1XXX and indicates a channel number of 80 or higher. The output of AND 500 is connected to one input of a first stage NOR 505 and to one input of a four input tens counter OR 542. AND 504 is connected to a second input of NOR 505 and to one input of a four input tens memory or 544. The output of NOR 505 is connected directly to the inputs of second stage AND's 508 and 510, and, through an inverter 511, to one input of a second stage NOR 512 and will be seen to enable the second stage gates when equality exists in the first stage. It will be noted that the comparison occurs independent of any timing signals and consequently the comparator is functioning all of the time.

In the second state, TC is connected to another input of AND 508, and, through an inverter 514, to another input of AND 510 while TC' connects to the third input of AND 510 and, through an inverter 516, to the third input of AND 508. The output of AND 508 is connected to another input of NOR 512 and to a second input of tens counter OR 542. Similarly, the output of AND 510 is coupled to the third input of NOR 512 and to a second input of tens memory OR 544. Lastly, the output of NOR 512 connects to inputs of third stage AND's 520 and 522, and, through an inverter 523, to an input of a third stage NOR 524.

In the third stage, TB and TB' are similarly connected to counter and memory AND's 520 and 522, with inverters 526 and 528. The outputs of AND's 520 and 522 are connected respectively to inputs of NOR 524 and to third inputs of OR's 542 and 544. NOR 524 is coupled to the inputs of the fourth stage AND's 532 and 534, and, via an inverter 535, to one input of a tens equality NOR 536.

The fourth stage is similarly arranged with TA and TA' connected to AND's 532 and 534, with inverters 538 and 540. The outputs of the AND's are connected, respectively to tens equality NOR 536 and to the fourth inputs of OR's 542 and 544.

The tens comparator tri-flop consists of three NAND's interconnected with three AND's, each having its outward inverted and coupled to the inputs of the other two AND's. The tri-flop provides "state retention", i.e., the TRU, TRD, or TRE signals as indicated by the tens comparator. It also includes circuitry for preventing logic failures which might occur under a particular set of operating conditions.

Assume the television receiver is turned on with a keyboard input of a Band 1 channel. (As will be seen, Band 2 channels may have the same effect.) The logic circuit is fully activated very quickly. The tuner could experience weak or delayed oscillation under certain operating conditions for the varactor diode and fail to produce the sufficient number of PS pulses to drive the counters far enough past their preset positions. (The preset is 8 in the tens counter and 5 in the units counter for both Band 1 and Band 2 channels which, as far as the comparator is concerned, would look like channel 85 during the compare interval.) If channel 2 were selected, normally the modular scaler would deliver 17 CU transition pulses to the units counter which, with a 5 preset, would in turn deliver 2 CT transition pulses to the tens counter, leaving a units count of 2 and a tens count of 0. However, if only 14 CU pulses were received, because of a temporary oscillator condition, the units counter would register 9 and the tens counter, which would receive only 1 CT pulse would register 9 and during the compare interval the oscillator frequency will be deemed to be much too high (channel 99) whereas in reality it isn't nearly high enough. Under these conditions, a ramp voltage down signal would be produced and prevent correction. To obviate this situation, under such conditions, the circuit logic forces a ramp up signal.

The output of tens counter OR 542, tens equality NOR 536 and tens memory OR 544 are connected to one input respectively of a NAND 548, a NAND 550 and a NAND 552. Timing signal $\overline{\phi_1}$ is coupled to the second inputs of the NAND's which are, therefore, enabled only during the compare interval when $\overline{\phi_1}$ is at a 1 level. The output of NAND 548 is connected to inputs of an AND 558 and an AND 560; the output of NAND 550 to inputs of an AND 556 and AND 560; and the output of NAND 552 to inputs of AND 556 and AND 558. The output of AND 556 is connected to an input of an AND 572, and, through an inverter 555, to a third input of AND 558 and a third input of And 560. The output of AND 560 is connected to one input of an OR 564 and through an inverter 559 to the fourth input of AND 558 and the third input of AND 556. The output of AND 558 (labelled TRE — tens ramp equal) is connected, through an inverter 557 to the fourth inputs of AND 556 and AND 560.

The logic failure circuitry consists of: a BA signal from band decoder 52 coupled through an inverter 566 to one input of an AND 568; counter bit TD coupled to its second input; and the output of AND 568 being connected to the second input of OR 564 and, through an inverter 570, to the second input of AND 572. The output of OR 564 is labelled TRU — tens ramp up and the output of AND 572 is labelled TRD — tens ramp down.

The operation of the various comparator stages will be described for (A) a memory bit of 0 and a corresponding counter bit of 1; (B) a memory bit of 1 and a counter bit of 0; and (C) memory and counter bits both 1 or 0. Thus, for the first stage TD is (A) 1, (B) 0 and (C) either 1 or 0, and TD' is (A) 0, (B) 1 and (C) either 1 or 0. With these values of TD and TD', the corresponding outputs from AND 500 and AND 504 are respectively (A) 1 and 0, (B) 0 and 1 and (C) 0 and 0. Thus, the output of AND 500 is at 1 only for condition (A) when the first stage bit in the tens counter is larger than the corresponding memory bit. This 1 level signal inhibits a 0 level output of tens counter OR 542, keeping its output at 1, which results in a 1 level ramp down signal. (AND 504 is at 0 and enables tens memory OR 544, keeping its output at 0.)

Similarly, AND 504 is at 1 only for condition (B) when the first stage tens memory bit is larger than the corresponding counter bit. AND 504 at 1 results in an input of tens memory OR 544 being at 1 which, in turn results in a 1 level ramp up (TRU) signal, thereby inhibiting a 0 level output signal. Correspondingly AND 500 enalbes OR 452 under condition (B) and inhibits NOR 505 which insures all other inputs to OR 542 are at 0 which maintains its output at 0. It may be seen that if either input to NOR 505 is at 1, its output will be at 0 and second stage AND's 508 and 510 and NOR 512 will be inhibited. For condition (C), the tens memory and counter first stage bits are equal and the outputs of AND 500 and AND 504 remain at 0 enabling both OR 542 and OR 544. The output of NOR 505 is now at 1 and enables second stage AND's 508 and 510 and, through inverter 511, NOR 512.

Thus an inequality in the tens comparator first bit stage inhibits the corresponding tens counter or memory OR gate from responding to later stages and produces a ramp control signal. The AND gates and NOR gates of the subsequent stages are inhibited until equality is achieved in the first bit stage. Conversely, whenever the first stage AND outputs are at 0, indicating equality, both counter and memory OR gates, and the second stage AND's and NOR are enabled transferring control of the tens counter and memory OR's to the next stage.

With the gates of the second stage enabled, the operation is the same with TC and TC' now being compared. Thus when TC is (A) 1, (B) 0 and (C) either 1 or 0, and TC' is (A) 0, (B) 1 and (C) either 1 or 0, the corresponding outputs of AND 508 and AND 510 are respectively (A) 1 and 0, (B) 0 and 1 and (C) 0 and 0. Thus, the output of AND 508 is at 1 only for condition (A) when the tens counter second stage bit is larger than the corresponding memory bit. The 1 level signal inhibits tens counter OR 542, keeping its output at 1, whereas AND 510 at 0 enables tens memory OR 544 in the same manner as the earlier stages. Similarly, AND 510 is at 1 for condition (B) and results in one of the inputs of OR 544 being at 1, thereby assuming a 1 level output signal.

For condition (C), TC and TC' are equal and the outputs of AND 508 and AND 510 are at 0. The output of NOR 512 is at 1 (whereas for (A) and (B), NOR 512 was at 0) and enables the third stage gates.

Bit equality in the second stage transfers control of the OR gates to the third stage and bit equality in the third stage transfers control to the fourth stage. When the bit comparison at the fourth stage indicates equality, the output of tens equality NOR 536 is at 1 and both the outputs of counter 542 and memory OR 544 are at 0. These signal levels are supplied to the tri-flop circuit. Note that the tens counter OR 542 is at 1, when condition (A) occurs at any stage that has control. Similarly, the output of tens memory OR 544 is at 1 when condition (B) occurs at any stage that has control. The output of NOR 536 is at 1 only under condition (C) (equality) in all four bit stages. (Only one of OR 542, OR 544 and NOR 536 can have a 1 level output at any given time.)

During the $\overline{\phi}_1$ compare interval, the three input NAND gates 548, 550 and 552 of the tri-flop are enabled to interrogate the status of tens comparator 51A. Each NAND output is normally at 1 (inhibited) and is at 0 only when both its inputs are at 1. Hence it may be seen that the corresponding outputs of NAND 548, NAND 550 and NAND 552, during $\overline{\phi}_1$ at 1, are respectively the inverses of the output signal levels of OR 542, NOR 536 and OR 544. Likewise, the outputs of AND 556, AND 568 and AND 560 may be shown to be identical with the outputs of OR 542, NOR 536 and OR 544, respectively, during the compare interval.

Assume OR 542 at 1, NOR 536 at 0, and OR 544 at 0. AND 548 is at 0, and AND's 552 and 550 are at 1 which places two of the inputs of AND 556 at 1, whereas one input each of AND 558 and 560 is at 0. These latter AND's thus have their outputs at 0 and, through inverters 557 and 559, place the other two inputs of AND 556 at 1, which causes its output to be at 1, which in turn enables AND 572, and provides a TRD 1 level signal for energizing ramp voltage source 68.

The tens comparator operates continuously, but it is only "looked at" or interrogated when $\overline{\phi}_1$ is at 1, which allows the tri-flop NAND gates to respond to the output conditions of the tens memory and tens counter OR gates and the tens equality NOR gate. As will be discussed, the units comparator, works in conjunction with the modular comparator, which is also controlled by a tri-flop arrangement and interrogated during the compare interval.

The tri-flop also "retains" its tens state, i.e., ramp up (TRU at 1), ramp down (TRD at 1) or equality (TRE at 1) until the comparator indicates a change during a subsequent compare interval. To understand this retention assume the condition above with AND 556 at 1 and AND's 558 and 560 at 0. The 1 level output at AND 556 keeps one input of each of the other two AND's at 0 and thus inhibits them. They, in turn, through inverters 557 and 559, maintain two of the inputs of AND 556 at 1 (enabled). Its other two inputs are also normally held at 1 by NAND's 550 and 552. Thus when $\overline{\phi}_1$ goes to 0 (compare interval ends) AND 556 stays at 1 and the state of the tens comparator is retained.

The logic failure circuitry includes AND 568 and inverters 556 and 570. One input of AND 568 is supplied with tens counter bit signal TD and the other with inverted band decoder signal BA, which is at 0 for channels occurring in Bands 1 and 2. If a Band 1 or 2 channel is selected and an insufficient number of pulses are available to cause the tens counter to advance through 0 from its preset of 8, TD will be at 1 during the compare interval. TD at 1 corresponds to a channel number of 80 or more in the counter, whereas the memory "requests" a channel number of less than 10. Since the inversion of BA is also at 1, the output of ANd 568 is at 1. Inverter 570 thus supplies the second input of AND 572 with a 0 level inhibiting signal and prevents a 1 level TRD signal which would drive the ramp down. The 1 level signal at the output of AND 568 is supplied to OR 564 which forces a 1 level TRU signal (irrespective of the condition of the other input of OR 564), resulting in an increase in voltage supplied to the varactor. This is, of course, what is desired under the abnormal conditions assumed. Conversely, if TD is 0, the output of AND 568 is at 0, enabling OR 564 and, through inverter 570, enabling AND 572 which returns to normal operation. For channel inputs in Bands 3 and 4, BA is at 1 and its inversion inhibits AND 568. Consequently, the circuitry is only effective for the assumed conditions.

Units Comparator 51B (FIG. 10B)

The units comparator of FIG. 10 is also a four stage bit comparator similar to the tens comparator with the exception that it doesn't include a tri-flop or oscillator failure logic circuitry. The units comparator includes a units counter OR and a units memory OR for producing the units ramp down (URD) and units ramp up (URU) signals and units ramp equal (URE) signals for modular comparator 51C. The units OR's each have five inputs, one of which is inhibited by a 1 level TRD or TRU signal from the tens comparator. Thus the appropriate units transmission gate in the ramp voltage source is energized along with the corresponding tens transmission gates to increase the rate of change in voltage across the tuning capacitor and increase the ramp speed for inequalities in the tens digit. The tens comparator TRE signal enables the units comparator, while the corresponding 0 level TRD and TRU signals turn off transmission gates 256 and 258 in ramp voltage source 68.

The TRD lead is connected to one input of units counter or 648 and the TRU lead is connected to one input of units memory or 650, thereby insuring that any inequality in the tens comparator overrides the units comparator and that the tens comparator is satisfied first. Control of the ramp voltage source is transferred from tens comparator 51A to the first stage of units comparator 51B by a TRE 1 level signal which is connected to one input of an AND 600, one input of an AND 604, and through an inverter 601, to one input of a NOR 602. UD from the counter is connected to a second output of AND 600 and, through an inverter 606, to a second input of AND 604 while UD' from the memory is connected to a third input of AND 604 and, through an inverter 608, to the third input of AND 600. The output of AND 600 connects to a second input of units counter OR 648 and to a second input of NOR 602. The output of AND 604 connects to a second input of units memory OR 650 and to the third input of NOR 602.

The units comparator second stage is the same, with the output of NOR 602 connected to AND 612, AND 616, and through inverter 613 to NOR 614. UC and UC' are connected to AND's 612 and 616 with inverters 618 and 620. AND's 612 and 616 connect to the third inputs of OR 648 and OR 650, respectively, and to NOR 614.

The third bit stage is also the same. Its gates are enabled by NOR 614 and its AND's 624 and 628 control OR's 648 and 650 and NOR 626 for transferring control to the next stage. Signals on leads UB and UB' from the counter and memory are compared in this stage.

In the fourth stage, which is enabled by NOR 626, the least significant bits in the units memory and counter are compared. As with previous stages, AND's 638 and 642 control the respective counter OR 648 and memory OR 650 and, a determination of equality operates the fourth stage NOR 640. The output of units counter OR 648 is labelled URD, the output NOR 640 is labelled URE and the output of units memory OR 650 is labelled URU.

The operation of the units comparator is the same as that previously described for the tens comparator exept that its control of the ramp voltage source is solely through the modular comparator. The OR gate output signals URD and URU as well as the output signal of NOR 640 are thus applied to modular comparator 51C. Also, while the memory and counter binary bits are compared continually in all stages, only the most significant stage has control of the respective OR gates.

Modular Comparator 51C (FIG. 10C)

The modular comparator 51C monitors two leads from modular scaler 62 to determine its state or residue. If the residue is acceptable as discussed previously with respect to the window, and if equality in both units and tens counters exists, the ramp voltage change is stopped. Unlike the previous comparator sections the modular comparator does not have 4 stages for binary bit comparison. Rather, it identifies the residue as being less than, equal to, or greater than, the two preselected residues and contains tri-flop circuitry to retain this information. The comparator circuitry consists of 3 AND's, 2 OR's and two inverters appropriately interconnected and supplied with signals from the units comparator and modular scaler. The tri-flop is identical with the one in the tens comparator and has three NAND's, three AND's and three inverters.

As was true for the units comparator, the modular comparator is "overriden" when an inequality exists between the units digit (or tens digit) in the counter and that in the memory. Thus, OR 712 is supplied with the overriding URD signal and OR 710 supplied with the overriding URU signal and the modular comparator AND gates are enabled by the URE signal. Thus a determination of inequality in the units comparator is passed through the OR gates and the modular comparator AND gates are inhibited by URE being at a 0 level.

Lead URE is connected to one input each of an AND 700, an AND 702 and an AND 704. Lead PC, the Q terminal of flip-flop 404 in modular counter 62, is connected to one input of AND 702, to a second input of AND 700 and, through an inverter 714, to one input of AND 704. Lead PB, the Q terminal of flip-flop 402, is connected to the third input of AND 700 and, through an inverter 716, to the third input of AND 702. The outputs of AND's 702 and 704 connect to the second inputs of OR's 712 and 710, respectively.

The tri-flop NAND's 720, 722 and 724, each have one input connected to the outputs of OR 712, AND 700 and OR 710, respectively, and one input supplied by $\bar{\phi}_1$. The output of NAND 720 is connected to one input each of an AND 728 and an AND 730, the output of NAND 722 connects to one input each of an AND 726 and AND 730, and the output of NAND 724 to one input each of AND 728 and AND 726. The output of AND 726 labelled RD (ramp down), is connected through an inverter 725 to a third input of AND 728 and to the third input of AND 730. Similarly the outputs of AND 728 and AND 730 are connected through inverters 727 and 729 to the inputs of the other two AND's. The output of AND 730 is labelled RU (ramp up). The RU and RD leads are connected respectively to transmission gates 256 and 264 in the ramp voltage source of FIG. 7.

Assume equality in the tens and units comparators for the following examples. The tens comparator signals TRD and TRU and the units comparator signals URD and URU are all at 0 and the TRE and URE signals at 1, the latter enabling the gates of modular comparator 51C. The state of the modular comparator is determined by the residue in modular scaler 62. As discussed, the window is defined by accepting residues corresponding to the 4th and 5th states. It thus remains to determine the relationship of the actual scaler residue to these acceptable states. From Table 4 of FIG. 11, the Q outputs of both flip-flops 402 and 404 are at 1 only when counter 62 is in states 4 and 5. Under these conditions, modular comparator 51C should designate RU and RD signals at a 0 level, i.e., no ramp change. For residues corresponding to state 6, an RD 1 level signal should be generated and for states of 3 or less an RU 1 level signal should be produced.

For residue values corresponding to states 4 and 5, both PC and PB are at 1 levels, and the output of AND 700 is at 1. PB, through inverter 716, supplies a 0 level signal to AND 702, thus causing the output of OR 712 to be at 0. PC through inverter 714 inhibits AND 704 and its output is at 0, assuring that the output of OR 710 is then also at 0. $\bar{\phi}_1$ at 1 during the compare interval enables NAND 722. The modular tri-flop operates in the same manner as the tens comparator tri-flop, in that the input levels are duplicated at the outputs of the tri-flop and maintained until the next compare interval. Thus, the output of AND 728 is at 1 indicating equality. Correspondingly, the RU and RD signals are at 0.

When the tuner is a little too high in frequency (above the range of frequencies defined by the window, but not high enough to change the equality states in the units comparator) the modular scaler is in state 6 and an RD 1 level signal is needed. For this condition, PC is at 1 and PB is at 0. PC inverted places a 0 level at an input of AND 704, forcing its output to a 0 level and operating OR 710, whose output assumes a 0 level. PB at 0 inhibits AND 700 and its output is also at 0. The inverted PB signal at the input of AND 702, in conjunction with the 1 level PC and URE signals place its output at 1 which inhibits OR 712, thus resulting in a 1 level output and 1 level RD signal.

For tuning slightly below the range of frequencies defined by the window the counter states may be 1, 2, or 3 for which PC is at 0. PC at 0 activates AND 704 and results in a 1 level output at OR 710 which produces a 1 level RU signal. PC at zero inhibits AND 702 and AND 700 insuring that only an RU signal is produced. Thus the system tuning is satisfied only for signals corresponding in frequency to the frequencies determined by the tens and units counters and modular scaler residues. The system AFC locks onto the received signal picture carrier and maintains tuning.

While the tuning system is continually sampling the oscillator frequency, a quiet space or null zone is provided in the small range of frequencies determined by the window. No corrective action is taken by the system unless unacceptable counts are received as determined in the comparator.

Thus the tuning system of the invention specifies any channel, by number, in the television bands to a degree of closeness which precludes acceptance of adjacent channel signals, yet broadly enough to enable acceptance of signals having minor deviations from their alloted frequencies.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. In a television tuning system including a voltage controllable oscillator for selectively tuning a plurality of fixed frequency bandwidth television channels in a predetermined range of frequencies, channel number selection means, voltage generating means for changing the tuning frequency of said voltage controllable oscillator and comparison means, the method of operating said tuning system comprising the steps of:
    encoding on a sample basis the tuning frequency of said oscillator into channel number information related to the channel numbers of corresponding receivable television channels;
    comparing channel number information from said channel number selection means with said channel number information from said oscillator;
    driving said voltage controllable oscillator from said voltage generator means until a preselected condition exists in said comparison means, said preselected condition occurring only when said oscillator tuning is within a restricted frequency range about the frequency corresponding to the channel number from said selection means, said restricted frequency range having two distinct bounds defining a non-zero interval and being substantially narrower than the frequency difference between adjacent television channels.

2. The method of claim 1, wherein said encoding step includes digitally counting the cycles of the oscillator output occurring during a fixed time interval and converting the counting information into a binary representation.

3. The method of claim 2, wherein said digital counting is performed on a modular basis with the modulus of the counter selected to produce residues corresponding to fractional intrachannel frequencies.

4. The method of claim 3, wherein said restricted frequency range is determined by selecting adjacent residues in the counter for satisfying said preselected condition.

5. The method of claim 4, wherein said digital counting is asynchronously gated with respect to the cycles of the oscillator output and wherein said residues are two in number and are immediately adjacent each other.

6. The method of claim 5, wherein said fractional intrachannel frequencies correspond to 1 MHz.

7. The method of claim 4, wherein said tuning system further includes automatic frequency control means for maintaining said voltage controlled oscillator locked to a received signal having a frequency in said restricted frequency range.

8. The method of claim 6, wherein said tuning system includes automatic frequency control means having a locking range in excess of 1 MHz.

9. In a television tuning system including a voltage controllable oscillator for selectively tuning a plurality of fixed frequency bandwidth television channels in a predetermined range of frequencies, channel number selection means, ramp voltage generating means for changing the tuning frequency of said voltage controllable oscillator, oscillator frequency counting means, comparison means, and timing sequence clock means, the method of operating said tuning system comprising the steps of:

sampling the frequency of said oscillator with said oscillator frequency counting means;

encoding the count in said counting means into channel number information related to the channel numbers of corresponding receivable television channels;

comparing channel number information from said channel number selection means with said channel number information from said counting means and generating a control signal responsive thereto;

driving said voltage controllable oscillator from said ramp voltage generator means under control of said control signal; and stopping said ramp voltage generator means for a preselected condition in said comparison means, said preselected condition occurring only when said oscillator tuning is within a restricted frequency range about the frequency corresponding to the channel number from said selection means, said restricted frequency range having two distinct bounds defining a non-zero interval and being substantially narrower than the frequency difference between adjacent television channels.

10. The method of operating a television tuning system as described in claim 9, wherein said clock means establishes a count time interval and a compare time interval, said sampling and encoding being performed during said count time interval, and said comparing being performed during said compare time interval.

11. The method of operating a television tuning system as described in claim 10, wherein said encoding step includes the step of encoding information designating the oscillator's frequency to within a fractional portion of the frequency difference between adjacent television channels.

12. The method of operating a television tuning system as described in claim 11, wherein said oscillator frequency counting means includes a counter yielding a count in decades, units and residue, with the residue information designating the oscillator's frequency to within said fractional portion.

13. The method of operating a television tuning system as described in claim 12, wherein said preselected condition occurs for predetermined adjacent residues of said counter in addition to correlation between decade and units in the comparison of channel number information.

14. The method of operating a television tuning system as described in claim 13, wherein said counter is asynchronously gated with respect to said oscillator frequency and said predetermined residues are two immediately adjacent states of said modular counter.

15. The method of operating a television tuning system as described in claim 13, wherein said tuning system includes automatic frequency control means for locking said voltage controllable oscillator to a received signal having a frequency within said restricted frequency range.

16. The method of operating a television tuning system as described in claim 14, wherein the base of said counter is selected to produce residues corresponding to 1 MHz frequency increments.

17. The method of operating a television tuning system as described in claim 16, wherein said clock means establish a reset time interval for resetting said counting means after said compare time interval and before said count time interval.

18. The method operating a television tuning system as described in claim 17, wherein the comparison is performed continually, but said comparison means is only interrogated during said compare interval.

19. The method of operating a television tuning system as described in claim 18, wherein said tuning system includes automatic frequency control means having a locking range in excess of 1 MHz.

20. A television tuning system, comprising:
a voltage controllable oscillator for selectively tuning a plurality of fixed frequency bandwidth television channels in a predetermined range of frequencies;
means for encoding on a sample basis the tuning frequency of said oscillator into channel number information related to the channel numbers of corresponding receivable television channels;
channel number selection means;
comparison means for comparing channel number information from said channel number selection means with said channel number information from said encoding means; and
voltage generating means, responsive to said comparison means, for changing the tuning frequency of said voltage controllable oscillator until a preselected condition occurs in said comparison means corresponding to said oscillator tuning being within a restricted frequency range about the frequency corresponding to the channel number from said selection means, said restricted frequency range having two distinct bounds defining a non-zero interval and being substantially narrower than the frequency difference between adjacent television channels.

21. The television tuning system of claim 20 further including timing sequence generating means; said means for encoding being enabled during a count time interval by said timing means and including a digital counter counting the cycles of said oscillator during said count time interval and means for converting the count into a binary representation.

22. The television tuning system of claim 21 wherein said digital counter includes a modular scaler providing residues corresponding to fractional intrachannel frequencies.

23. The television tuning system of claim 22 wherein said preselected condition in said comparison means corresponds to equality in said channel number comparison and occurrence of one of a set of adjacent residues in said modular scaler.

24. The television tuning system of claim 23 wherein the base of said modular scaler is an integral multiple of six.

25. The television tuning system of claim 24 wherein said encoding means are asynchronously gated with respect to said oscillator and wherein said set of adjacent residues comprise two immediately adjacent residues in said scaler.

26. The television tuning system of claim 25 wherein the base of said modular scaler is 6 and said intrachannel fractions correspond to frequencies of 1 MHz.

27. The television tuning system of claim 23 wherein saaid tuning system further includes automatic frequency control means for maintaining said voltage controlled oscillator locked to a received signal having a frequency in said restricted frequency range.

28. The television tuning system of claim 26 wherein said tuning system includes AFC means having a locking range in excess of 1 MHz.

29. A television tuning system comprising:
a voltage controllable oscillator for selectively tuning a plurality of fixed frequency bandwidth television channels in a predetermined range of frequencies;
channel number selection means;
timing sequence generating means;
oscillator frequency counting means, coupled to said voltage controllable oscillator, controlled by said timing sequence generating means producing channel number information including intrachannel spacing information,
comparison means coupled between said channel number selection means and said oscillator frequency counting means for comparing respective channel number information and including means for comparing said intrachannel spacing information with predetermined spacing information, said comparison means producing a control signal dependent upon the comparison; and
voltage generating means for changing the tuning frequency of said voltage controllable oscillator under control of said control signal until a preselected condition occurs in said comparison means, said preselected condition occurring only for equality in said channel number information comparison and a particular relationship between said intrachannel spacing information and said predetermined spacing corresponding to said oscillator tuning being within a restricted frequency range about the frequency corresponding to the channel number from said selection means, said restricted frequency range being substantially narrower than the frequency difference between adjacent television channels.

30. The television tuning system of claim 29, wherein said timing sequence generating means provides non-overlapping time intervals on a continuous basis.

31. The television tuning system of claim 30, wherein said oscillator frequency counting means is enabled during a count time interval and said comparison means operates during a compare time interval, said counting means comprising a modular scaler and units and tens counters with the modular scaler providing residues related to said intrachannel spacing.

32. The television tuning system of claim 31, wherein said particular relationship is established when said intrachannel spacing information corresponds to adjacent residues of said modular scaler.

33. The television tuning system of claim 32, wherein said tuning system further includes automatic frequency control means for maintaining said voltage controlled oscillator locked to a received signal having a frequency in said restricted frequency range.

34. The television tuning system of claim 32, wherein the base of said modular scaler is an integral multiple of six.

35. The television tuning system of claim 34, wherein said oscillator frequency counting means is asynchronously gated with respect to said oscillator and wherein said adjacent residues comprise two immediately adjacent residues of said scaler.

36. The television tuning system of claim 35, wherein the base of said modular scaler is 6 providing residues corresponding to intrachannel frequencies of 1 MHz.

37. The television tuning system of claim 36, wherein said timing sequence generating means establishes a reset time interval, and means resetting said counting means during said reset time interval.

38. The television tuning system of claim 37 further including means presetting said counters and scaler in accordance with the selected channel number during said reset time interval.

39. The television tuning system of claim 38, wherein said tuning system includes automatic frequency control means having a locking range in excess of 1 MHz.

40. A television tuning system for selectively tuning a plurality of fixed frequency bandwidth television channels designated by distinct channel numbers comprising:
voltage controllable local oscillator frequency (LOF) means for selectively tuning to a plurality of fixed frequency bandwidth television channels in a predetermined range of frequencies;
viewer accessible keyboard means for selecting and binary encoding channel numbers;
clock pulse generator means for establishing recurrent, distinct, non-overlapping timing intervals;
logic gating means coupled between the local oscillator frequency means and the clock pulse generator means sampling the LOF pulses during a count time interval;
oscillator frequency counting means coupled to said logic gating means responsive to said LOF pulses comprising a base 6 modular scaler, producing binary coded residues corresponding to 1 MHz intrachannel fractions and units and tens counters producing binary coded channel numbers;
comparison means coupled between said keyboard means and said oscillator frequency counting means for comparing the viewer selected channel numbers with the units and tens counters and for comparing the intrachannel fraction with a preselected set of intrachannel fractions, said comparison means producing a ramp change control signal for an inequality in either comparison and a ramp stop control signal only for equality in both comparisons; and
ramp voltage means for changing the frequency of said voltage controllable local oscillator frequency means in response to said ramp change control signal and terminating said change in response to said ramp stop control signal, said ramp stop control signal only being developed when the oscillator tuning is within a restricted frequency range about the frequency corresponding to the selected channel number, said restricted frequency range being substantially smaller than the frequency difference between adjacent channels.

41. The television tuning system of claim 40, wherein said logic gating means are asynchronously related to said oscillator frequency pulses and wherein said intrachannel fractions comprise two immediately adjacent residues in said scaler.

42. The television tuning system of claim 41, wherein said tuning system further includes automatic frequency control means having a locking range in excess of 1 MHz.

43. The television tuning system of claim 42, wherein said comparison means operates continuously, but is only interrogated during a compare time interval after occurrence of said count time interval.

44. The television tuning system of claim 43, wherein said counting means are reset during a reset time interval after said compare time interval; and further including band decoding means for determining the frequency band of the selected channel and presetting the modular scaler and units and tens counters with appropriate counts.

* * * * *